United States Patent [19]

Bendall

[11] Patent Number: 4,742,303
[45] Date of Patent: * May 3, 1988

[54] DEPTH AND REFOCUSING PULSES FOR USE WITH INHOMOGENEOUS RADIOFREQUENCY COILS IN NUCLEAR MAGNETIC RESONANCE SPECTROSCOPY

[76] Inventor: Max R. Bendall, 274 Fort Road, Burbank, Queensland, Australia, 4123

[*] Notice: The portion of the term of this patent subsequent to Dec. 4, 2001 has been disclaimed.

[21] Appl. No.: 775,573

[22] Filed: Sep. 13, 1985

Related U.S. Application Data

[63] Continuation-in-part of Ser. No. 516,729, Jul. 25, 1983, abandoned, which is a continuation-in-part of Ser. No. 443,607, Nov. 22, 1982, Pat. No. 4,486,709.

[51] Int. Cl.$^4$ ............................................ G01R 33/20
[52] U.S. Cl. ...................................... 324/309; 324/314
[58] Field of Search ................. 324/307, 309, 311–314

[56] References Cited

U.S. PATENT DOCUMENTS

| | | | |
|---|---|---|---|
| 4,443,760 | 4/1984 | Edelstein et al. | 324/309 |
| 4,449,097 | 5/1984 | Young et al. | 324/309 |
| 4,471,305 | 9/1984 | Crooks et al. | 324/309 |
| 4,486,709 | 12/1984 | Bendall | 324/309 |

Primary Examiner—Stewart J. Levy
Assistant Examiner—Kevin D. O'Shea
Attorney, Agent, or Firm—Frank H. Foster

[57] ABSTRACT

In a pulsed nuclear magnetic resonance method of analysis, a series of phase cycled radiofrequency pulses of the form $2\theta$; $\theta[\pm x]$; $(2\theta[\pm,\pm y])_4$, called a depth pulse scheme, may be applied using an irradiation coil which provides an inhomogeneous radiofrequency field across the sample volume, so that signals may only be detected from sample regions where the pulse angle $\theta$ is close to $m\pi/2$, where m is an odd integer. However, signals from regions where $\theta = 3\pi/2$ or $5\pi/2$, if such regions exist, can be eliminated by varying some of the pulses from their ideal $\theta$ of $2\theta$ values. The sample discrimination afforded by means of these pulse schemes may be improved by using static or pulsed magnetic field gradients or by using more than one radiofrequency coil.

28 Claims, 11 Drawing Sheets

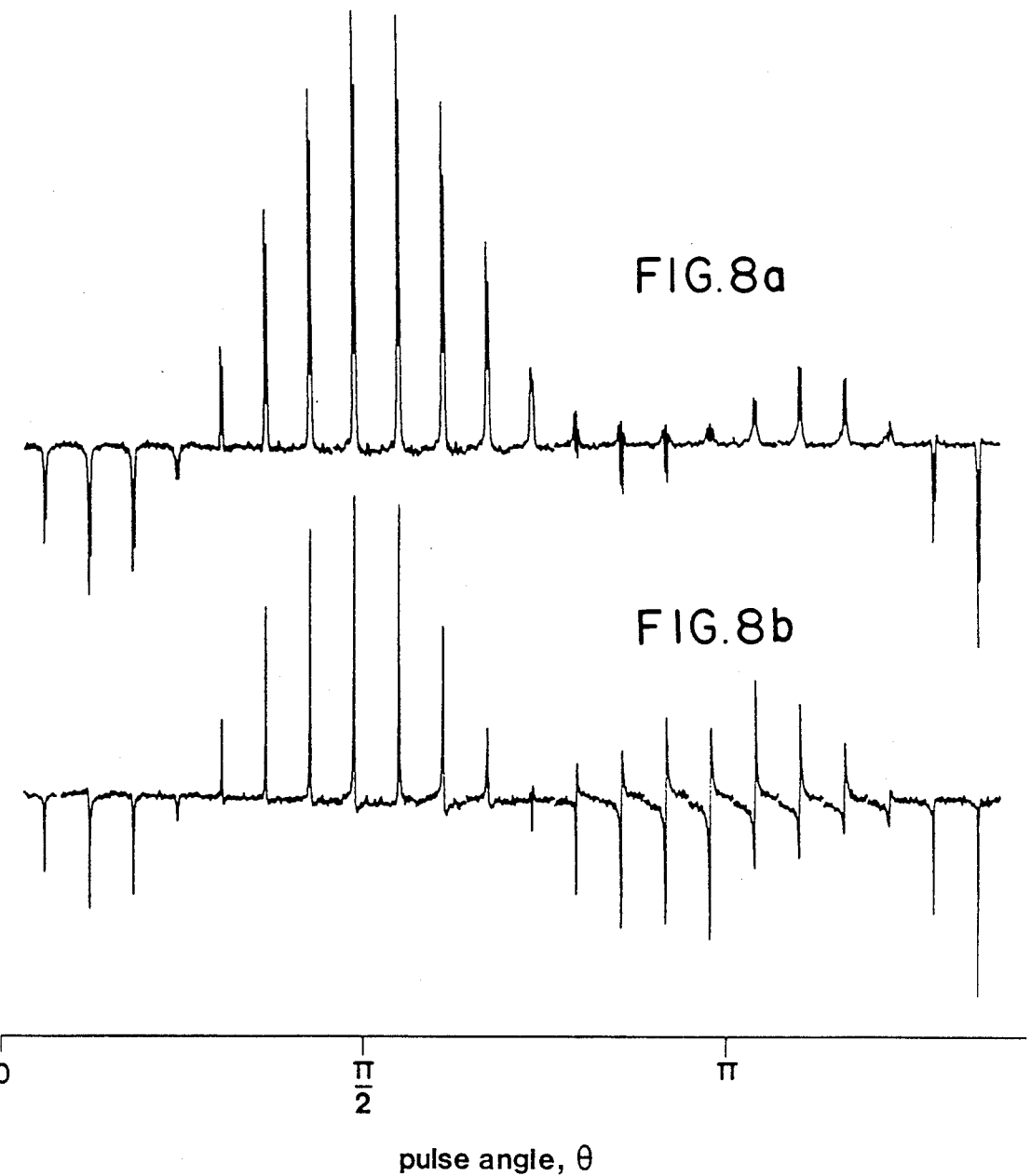

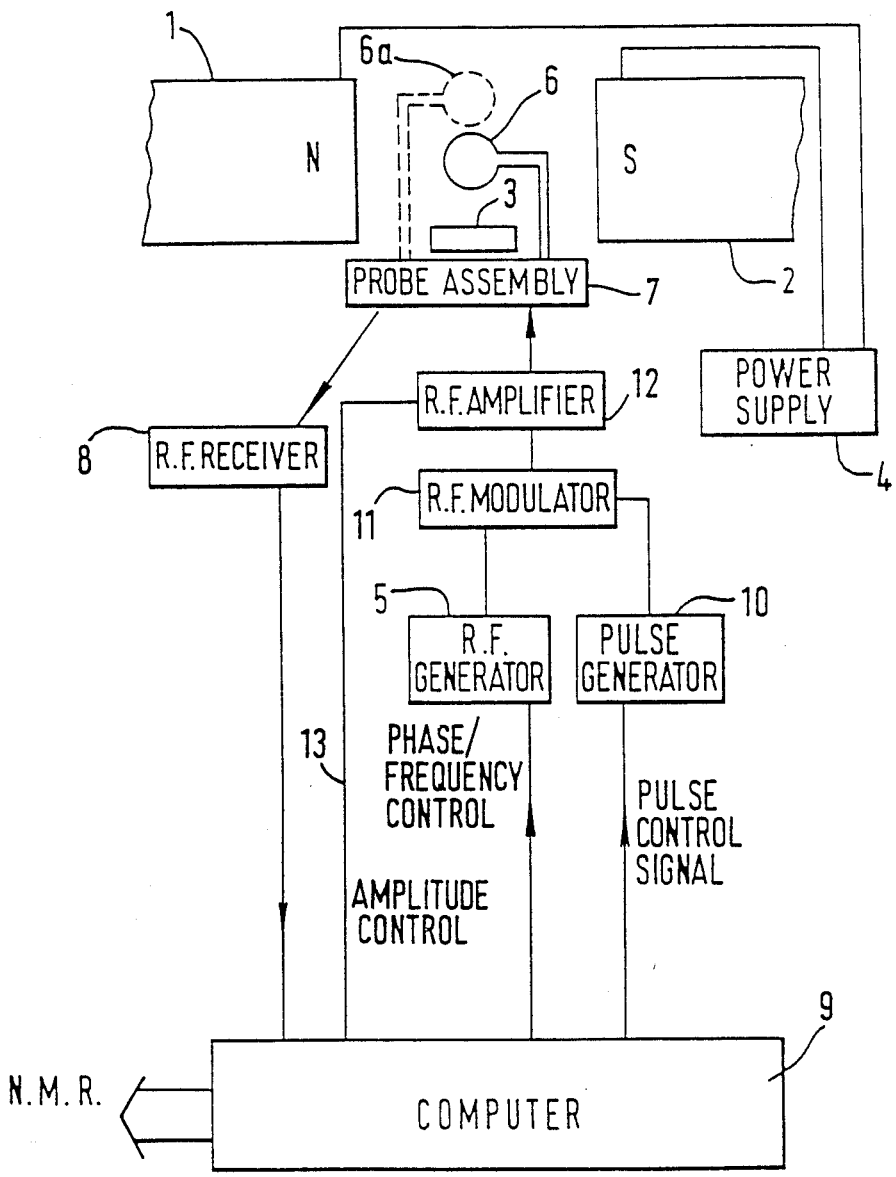

DEPTH AND REFOCUSING PULSES FOR USE WITH INHOMOGENEOUS RADIOFREQUENCY COILS IN NUCLEAR MAGNETIC RESONANCE SPECTROSCOPY

Application Ser. No. 516,729, abandoned, filed July 25, 1983 is a continuation-in-part of my then co-pending application Ser. No. 443,607, filed Nov. 22, 1982; now U.S. Pat. No. 4,486,709.

BACKGROUND

As described in U.S. Pat. No. 4,486,709, depth pulse schemes generate signals from sample regions where the excitation pulse $\theta$ is close to $m\pi/2$, where m is an odd integer. However signals from regions where $\theta = 3\pi/2$ or $5\pi/2$, if such regions exist, can be eliminated by varying some of the pulses from their ideal $\theta$ or $2\theta$ values. The sample discrimination afforded by means of these pulse schemes may be improved by using static or pulsed magnetic field gradients or by using more than one radiofrequency coil.

This invention relates to the application of specific radiofrequency pulse schemes to inhomogeneous irradiation coils in a nuclear magnetic resonance (NMR) method of analysis, so that only signals from specific sample regions may be detected and so that some multipulse NMR methods may be achieved.

The terminology used in this disclosure is commonly used in the NMR literature.

In an NMR experiment using a single excitation pulse, where this pulse is applied to a coil which provides a grossly inhomogeneous radiofrequency field, the pulse angle varies widely across the sample. If $\theta$ is the pulse angle at a point in the sample, the nuclear magnetization component, which is rotated in the transverse plane of the rotating plane by the pulse, is proportional to $\sin \theta$ and the signal detected using the coil is proportional to $\theta \sin \theta$. Thus the signal intensity from different parts of the sample varies widely. Furthermore, although there is some sample discrimination, in that some regions provide much more signal than others, the signal intensity is only close to zero from small regions where the $\theta$ pulse angle is close to $n\pi$ (n=0, 1, 2 ... ). For example, one method for obtaining a high resolution NMR spectrum from a selected portion of a larger sample, which has gained recent popularity, involves the use of a surface coil for irradiation and detection, placed on the surface of the sample as near as possible to the sample region which is to be examined. These unconventional coils are often used for whole animal and human NMR studies of metabolism where it is desirable to obtain in vivo spectra from individual tissues and organs lying on the surface or deep within the sample. The geometry of a surface coil determines that the excitation rf pulse angle decreases rapidly with penetration into the sample. For example, the pulse angle drops to one third at a depth of the radius of the surface coil. Clearly it is difficult to obtain definitive quantitative results with such a gross variation of pulse angle, and thus signal intensity, across the sample.

The various techniques of multipulse NMR depend on pulse angles being close to the ideal $\pi/2$ and $\pi$ values. When this is not so a wide variety of artifact or spurious signals are generated. Multipulse NMR using inhomogeneous radiofrequency coils would then seem to be impossible unless some means can be found to discriminate against sample regions where pulse angles diverge markedly from the ideal $\pi/2$ and $\pi$ values.

The prime object of this invention is to provide a means which will discriminate against some sample regions and select other sample regions, to the extent that the signal intensity in the experimental situation is vanishingly small from a large part of the normal sample volume, when using an inhomogeneous irradiation coil such as a surface coil.

It is a further object of this invention that it may be used for the application of various techniques of multipulse NMR using inhomogeneous irradiation coils.

The first object is accomplished in accordance with the invention by use of specific phase-alternated consecutive pulse schemes which require the pulse phases and receiver phase to be alternated in a prescribed way and which require the length of the pulses to be adjusted in a predetermined manner. The second object is accomplished by inserting delay periods in these pulse schemes in a prescribed manner.

In the drawings:

FIG. 8 shows spectra obtained for two cholesterol signals close to resonance and secondly for a cholesterol signal about 2000 Hz off-resonance, as a function of the pulse angle $\theta$, for the combined pulse $2\theta;\theta[\pm x]$.

FIG. 12 illustrates schematically apparatus for obtaining a localized nuclear magnetic resonance signal in accordance with the present invention.

DETAILED DESCRIPTION

Figure 1A:
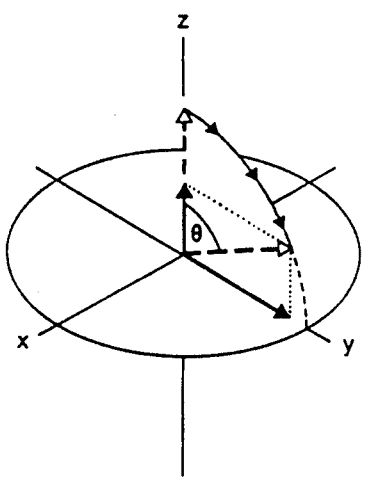
FIG. 1 is a representation of the effect of a $\theta[x]$ pulse on an initial z axis magnetization and secondly a representation of the effect of a $2\theta[y]$ pulse on the y axis component of the initial magnetization subsequent to the $\theta[x]$ pulse and subsequent to precession of the y axis component through an angle of $\beta$ degrees.

FIG. 12 illustrates schematically apparatus for obtaining a localized nuclear magnetic resonance signal. The apparatus comprises a magnet assembly having north and south poles 1 and 2, and a sample support 3, positioned to support the sample, for example a human patient, between the pole pieces 1 and 2. The magnet assembly may be a permanent magnet assembly, but is preferably a superconducting electro-magnet, powered by a power supply 4. Radiofrequency (Rf) generator 5 is provided to supply an Rf signal to a sample on the sample support, by means of an Rf coil 6. The Rf coil 6 is mounted on a probe assembly 7 of conventional form. An Rf receiver 8 is connected to a suitable receiving antenna, which may be the coil 6, or may be one or more other coils of conventional form, for example a coil 6a as illustrated schematically in FIG. 12. The Rf generator 5 and Rf receiver 8 are connected to a computer 9, programmed and arranged to control the phase and frequency of Rf signals produced by the Rf generator 5, and to receive signals from the Rf receiver 8 and process them as indicated herein, in order to obtain the desired NMR signal. A pulse generator 10 is also controlled by computer 9. The output from the pulse generator 10 is fed to an Rf modulator 11, which modulates the Rf signal produced by Rf generator 5, thereby to produce the desired sequence of Rf pulses. The sequence of Rf pulses is amplified by Rf amplifier 12, which not only controls the overall amplitude of Rf pulse signals fed to the probe assembly 7, but also, by means of control link 13, can control the relative amplitudes of individual Rf pulses, under the control of the computer 9. The computer 9 is so programmed and arranged as to produce the desired pulse range, as disclosed herein, according to methods which are generally known per se.

PHASE ALTERNATION OF π PULSES

In improving the Carr-Purcell method, Meiboom and Gill, Reviews of Scientific Instrumentation, 29, 688 (1958), found that the axis, along which nuclear magnetizations are refocused by a $\pi$ pulse, is inverted if the phase of the $\pi$ pulse is changed by 90° relative to the $\pi/2$ excitation pulse. Bodenhausen et al, Journal of Magnetic Resonance, 27, 511 (1977), used this property to eliminate ghost artifact signals from two dimensional $^{13}C$-$^1H$ J spectra obtained using a spin-echo sequence. The phase of the $\pi$ pulse was alternated by 90° for alternate transients and this was accompanied by alternate inversion of receiver phase. Bodenhausen et al also eliminated phantoms, a second type of artifact signal, by changing the phase of the $\pi$ phase by 180° without changing the receiver phase. The phase of the $\pi$ pulse was thus shifted through all four 90° shifts (or applied along all four axes of the transverse plane of the rotating plane) with inversion of receiver phase for ±90° phase shifts relative to the initial $\pi/2$ excitation pulse. Here, our shorthand notation for this procedure will be $\pi[\pm x, \pm y]$.

Although the effect of pulse imperfections in the two-dimensional NMR has led to valuable improvements, the application of schemes such as $\pi[\pm x, \pm y]$ are equally valuable in one-dimensional experiments to remove the effect of pulse imperfections. Consider the simple spin-echo sequence:

$$\pi/2 - \tau - \pi[\pm x, \pm y] - \tau - \text{acquire signal} \qquad [A]$$

When using inhomogeneous coils such as surface coils it is more meaningful to write this as $$\theta - \tau - 2\theta[\pm x, \pm y] - \tau - \text{acquire signal} \qquad [B]$$

because the pulse angles vary rapidly and continuously across the subject material and are only close to the ideal $\pi/2$ and $\pi$ values in the sample region of interest. A $2\theta$ pulse is defined simply as pulse which is twice as long as the initial $\theta$ excitation pulse.

Figure 1B:
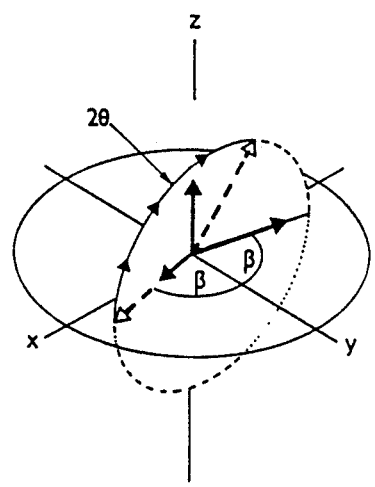

After a $\theta[x]$ pulse the initial nuclear magnetization vector will be at an angle, $(\pi/2-\theta)$, to the xy plane of the rotating frame. This can be resolved into two components, a z component of magnitude $\cos\theta$ and a y component of magnitude $\sin\theta$, see FIG. 1(a). The latter precesses during the subsequent $\tau$ period as a result of chemical shift off-resonance and other effects through an angle of $\beta$ degrees say. The effect of the $2\theta$ pulse will be to rotate this $\sin\theta$ component around the pulse axis by an angle of $2\theta$ as indicated in FIG. 1(b). As $2\theta$ pulse, on the y axis say, rotates this vector about the y axis, around the surface of a cone, half apex angle $\beta$ degrees. The vector arrowhead moves $2\theta$ degrees around the circular base of the cone. As shown by Kaiser et al, Journal of Chemical Physics, 60, 2966 (1974), this vector component may be resolved into two xy components, whose magnitudes are independent of the angle the $\sin\theta$ vector component makes to the pulse axis just prior to the $2\theta$ pulse *and thus independent of precession during* $\tau$, plus a z-axis component. One xy component remains along the direction of the $\sin\theta$ vector prior to the pulse. The second xy component lies in the xy plane at the position the total vector would take if the $2\theta$ pulse were a perfect $\pi$ pulse. Given that the vector component has magnitude $\sin\theta$ prior to the $2\theta$ pulse, the two xy components after the $2\theta$ pulse have magnitude $(\frac{1}{2})\sin\theta(1+\cos 2\theta)$ and $(\frac{1}{2})\sin\theta(1-\cos 2\theta)$ respectively, and the z-axis component has magnitude $\sin\theta\sin 2\theta\sin\beta$ where $\beta$ is the angle the $\sin\theta$ vector makes to the pulse axis prior to the pulse.

The z-axis component is not acquired in sequence [B] and can be disregarded for the moment. The second xy-component is refocused along the y-axis at the end of the second $\tau$ period if the $2\theta$ pulse is applied along the ±y axes (e.g. $2\theta[y]$ shown in FIG. 1(b)). Alternatively this xy-component is refocused along the -y axis if the $2\theta$ pulse is applied along the ±x axes. The signal resulting from this refocused component may be accumulated in sequence [B] by inverting the receiver phase when the $2\theta$ pulse is applied along the ±y axis. By definition, the direction of the first xy-component is independent of the magnitude and phase of the $2\theta$ pulse and thus may be considered to be unaffected by the $2\theta$ pulse and thus by the phase of the pulse. Consequently, the signal resulting from it is cancelled by the inversion of receiver phase.

The z-axis component (magnitude, $\cos\theta$) left after the $\theta$ pulse, will be partially rotated into the xy plane by the $2\theta$ pulse, leaving a z-axis component after the $2\theta$ pulse of magnitude $\cos\theta\cos 2\theta$ and an xy component of magnitude $\cos\theta\sin 2\theta$. The former is not acquired in sequence [B]. The phase of the latter is inverted by inversion of the $2\theta$ pulse phase and consequently the signal from this component is cancelled by cycling the $2\theta$ pulse through all four phases because the same receiver phase is retained when the $2\theta$ pulse phase is inverted.

The $(\frac{1}{2}) \sin \theta (1 + \cos 2\theta)$ component corresponds to the ghost signals, and the $\cos \theta \sin 2\theta$ component corresponds to the phantom signals found in two-dimensional $^{13}$C-$^{1}$H J spectroscopy and eliminated by Bodenhausen et al using the $2\theta[\pm x, \pm y]$ phase-cycling. For one-dimensional spin-echo applications both components will lead to phase errors if not removed by the phase-cycling, because precession in the xy plane resulting from chemical shift off-resonance is not refocused by the $2\theta$ pulse.

For inhomogeneous coils the $2\theta[\pm x, \pm y]$ phase cycling makes possible a number of valuable spin-echo applications as discussed in a later section. A second valuable property can be appreciated by a closer look at the magnitude of the acquired signal:

$$(\tfrac{1}{2}) \sin \theta (1 - \cos 2\theta) = \sin^3 \theta$$

Figure 2:
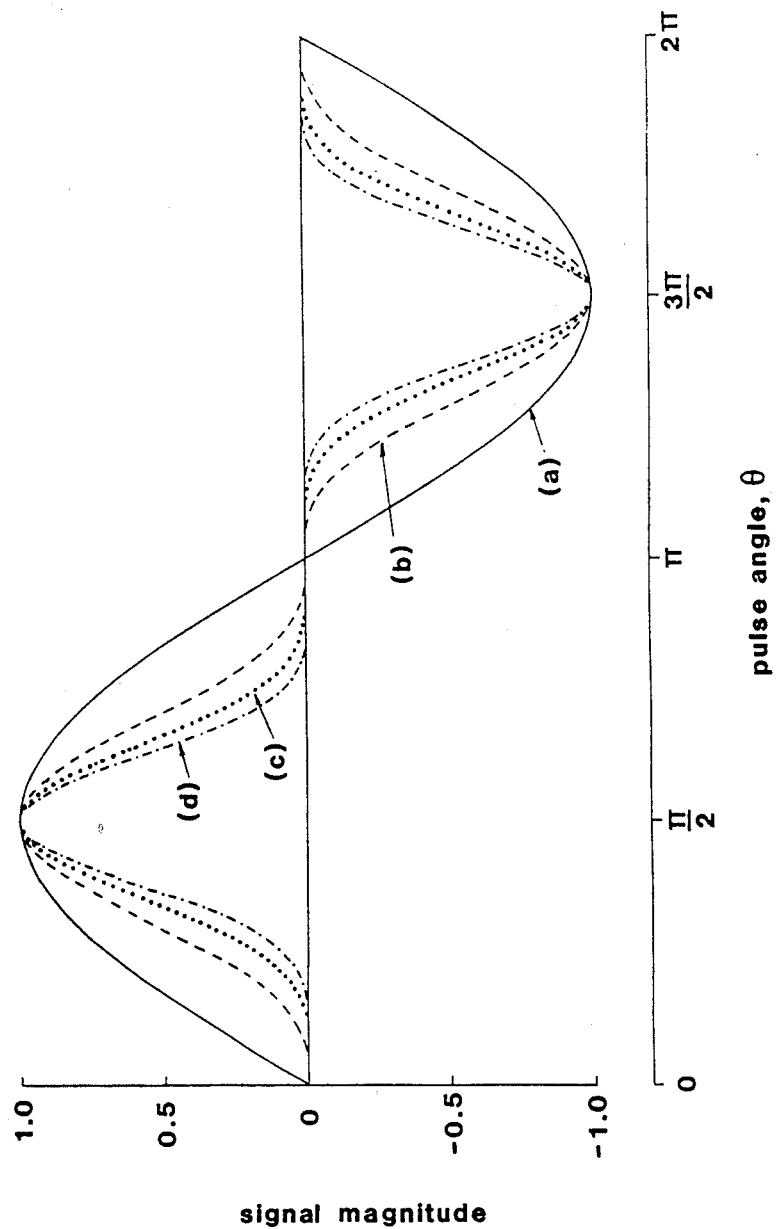
FIG. 2 shows plots of signal magnitude, as a function of the pulse angle $\theta$, following a single radiofrequency pulse and various depth pulses, $\theta;(2\theta[\pm x, \pm y])_n$, where n=1, 2, 3.

From a plot of $\sin^3 \theta$ versus $\theta$, FIG. 2(b), it can be seen that for large divergences of $\theta$ from $\pi/2$ the acquired signal is considerably smaller than would be obtained if a single 74 pulse were used, FIG. 2(a). This sequence [B] discriminates against sample regions where the pulse angle is different from $\pi/2$, to a much greater extent than a single excitation pulse. This can be used to advantage by setting $\theta$ to obtain the maximum signal from a certain sample region, or at a certain depth from the surface coil for instance, so minimizing the signal from either side of this region. Sequence [B] may thus be called a "depth sequence".

As already noted, the magnitude of the signal from sequence [B] is independent of the length of the $\tau$ waiting periods and so the $\tau$ periods may be removed altogether. There remains a complicated excitation pulse, $\theta;2\theta[\pm x, \pm y]$, which retains the valuable property of discriminating against sample regions where $\theta$ is divergent from $\pi/2$. We call this a "depth pulse".

The depth characteristics can be further improved by adding more $2\theta[\pm x, \pm y]$ pulses. In general, for a $\theta;(2\theta[\pm x, \pm y])_n$ pulse the magnitude of the acquired signal is $\sin^{n+1} \theta$. For example, consider $\theta;2\theta[\pm x, \pm y];2\theta[\pm x, \pm y]$. Clearly, for the phase-cycling to function properly the phase-cycling of the second $2\theta$ pulse must be *independent* of the phase-cycling of the first $2\theta$ pulse. That is, for every phase used for the first $2\theta$ pulse all four phases must be used for the second $2\theta$ pulse, or vice versa. A phase-cycle of 16 different combinations is thus required. In general, for $\theta;(2\theta[\pm x, \pm y])_n$, $4^n$ different combinations are necessary.

Consider $\theta;2\theta[\pm x, \pm y];2\theta[\pm x, \pm y]$, i.e. $\theta;(2\theta[\pm x, \pm y])_2$, in terms of magnetization vectors. Individual vector components may be considered as above for a single $2\theta[\pm x, \pm y]$ pulse, however generalisations can be made. The 90° phase shifts of the second $2\theta$ pulse accompanied by inversion of receiver phase will cancel any xy vector component which is unaffected by this pulse. Any xy vector component which is unaffected by the first $2\theta$ pulse is similarly cancelled by the independent 90° phase shifts of that pulse. Any z vector component left after the first $2\theta$ pulse (including both the $\sin \theta \sin 2\theta \sin \beta$ and $\cos \theta \cos 2\theta$ components), which is rotated into the xy plane by the second $2\theta$ pulse, is inverted by the 180° phase shifts of this pulse and is cancelled because the same receiver phase is retained. Any transverse magnetization resulting from the $\sin \theta \sin 2\theta \sin \beta$ z-axis component is cancelled by inversion of the $2\theta$ pulse, provided delay times and magnetic field inhomogeneity (and thus $\beta$) is constant between different transients, as is normally the case. The only signal that is accumulated over the 16 transient cycle corresponds to the magnetization component which is rotated into the xy plane by the $\theta$ pulse (component proportional to $\sin \theta$) and then affected by the $2\theta$ pulses as though they were $\pi$ pulses (proportional to $(\frac{1}{2})(1 - \cos 2\theta)$ for each $2\theta$ pulse). The final signal is thus proportional to $$\sin \theta [(\tfrac{1}{2})(1 - \cos 2\theta)]^2 = \sin^5 \theta.$$

The improvement expected by adding a second and third $2\theta[\pm x, \pm y]$ pulse is shown in FIG. 2(c) and FIG. 2(d) respectively, FIG. 2(c) showing the $\theta$ dependence of $\sin^5 \theta$ and FIG. 2(d) showing the $\theta$ dependence of $\sin^7 \theta$. The improvement is less for each additional pulse and it is probably not worthwhile adding the third $2\theta[\pm x, \pm y]$ pulse considering the factor of 4 increase in phase combinations.

Figure 3:
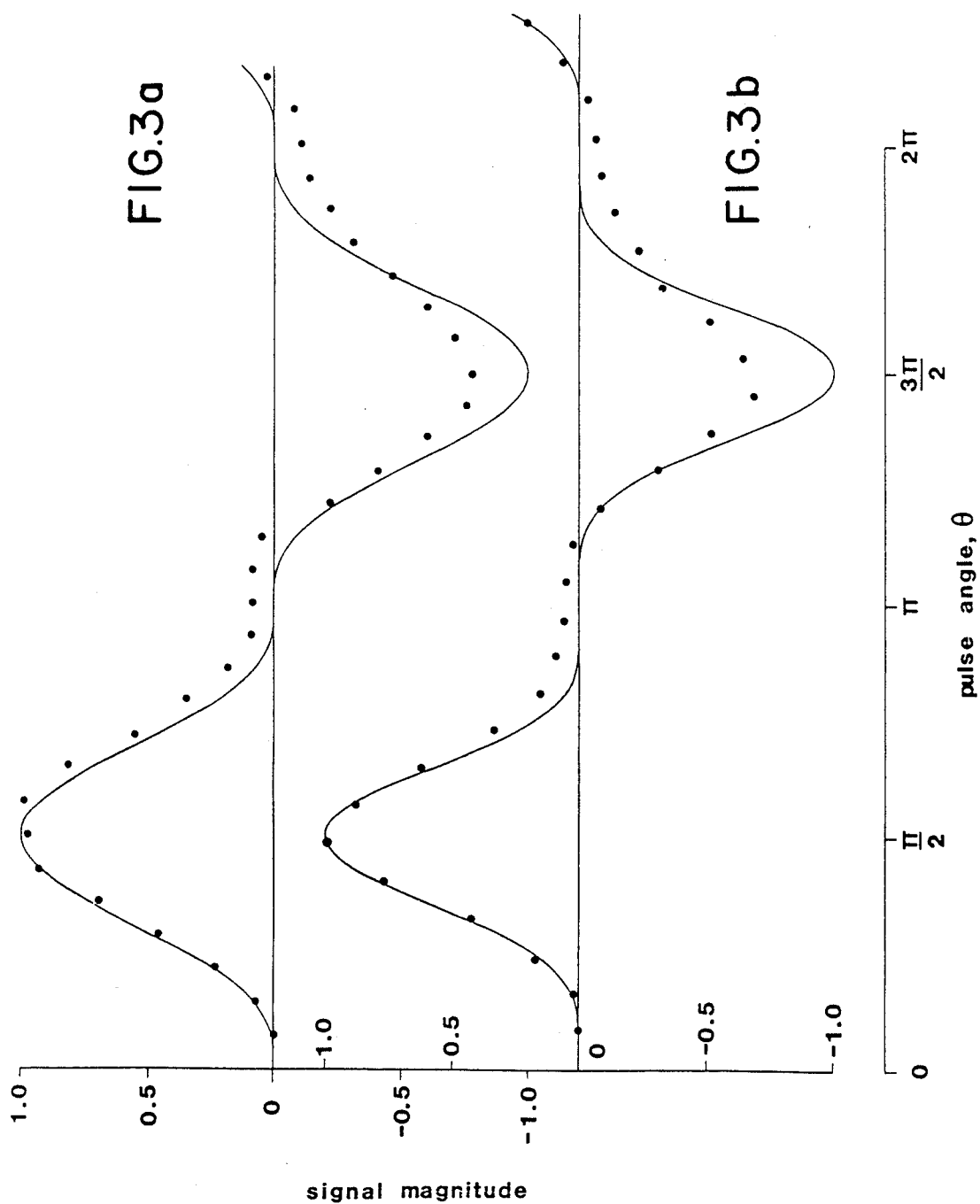
FIG. 3 shows experimental results (points) in comparison to theoretical curves for the depth pulse $\theta;2\theta[\pm x, \pm y]$ and secondly for the depth pulse $\theta;(2\theta[\pm x, \pm y])_2$.

Experimental verification of the above is provided in FIG. 3(a) for the depth pulse $\theta;2\theta[\pm x, \pm y]$ and in FIG. 3(b) for the depth pulse $\theta;(2\theta[\pm x, \pm y])_2$. These results were obtained using a standard 10 mm broadband probe in a high-resolution Bruker CXP-300 spectrometer. Each experimental point is the average intensity of four resonances in the $^{13}$C spectrum of a converted solution of cholesterol in CDCl$_3$ at 25° C. The sample was not restricted to the dimensions of the irradiation/detection saddle-coil. Although the pulses for this system are sufficiently homogeneous across the sample to verify the expected signal versus angle dependence, the effect of pulse inhomogeneity becomes more obvious for longer pulses. For example, when the main sample region feels a $\pi$ pulse, and thus produces a nil signal, the edge of this sample region will feel a smaller pulse angle and so produce a positive signal amplitude. If a rf pulse were homogeneous across the sample region, the signal amplitude after a $\theta;(2\theta[\pm x, \pm y])_n$ pulse when $\theta = \pi/2$ would be identical to that provided by a single $\pi/2$ pulse, because no signal components would be cancelled by the phase alternation. However, experimentally $\theta;2\theta[\pm x, \pm y]$ and $\theta;(2\theta[\pm x, \pm y])_2$ pulses gave signal amplitudes of 86.7±4.3% and 86.8±2.6% respectively when $\theta = \pi/2$ (experimentally $\theta = \pi/2$ corresponds to the maximum obtainable signal), compared to the signal after a single $\pi/2$ pulse. This also illustrates a modest rf inhomogeneity across the sample.

Similar results were obtained if $\rho$ periods were used, in agreement with theory. For spin-echo applications, it is only necessary to place the last $2\theta[\pm x, \pm y]$ pulse at the centre of the total delay period to achieve complete refocusing of chemical shift off-resonance. As expected, no $\tau$ dependent phase roll was observed across the spectrum. This is discussed in a later section.

These results are equivalent to those that would be obtained with a surface coil for a small phantom volume element.

PHASE ALTERNATION IN INVERSION-RECOVERY EXPERIMENTS

The most common application of pulse phase alternation to date is the phase inversion of the $\pi/2$ pulse in the $\pi$-$\tau$-$\pi/2$ inversion-recovery T$_1$ sequence, introduced by Demco et al, Journal of Magnetic Resonance, 16, 467 (1974). This phase alternation is accompanied by inversion of receiver phase and is used to remove the effects of imperfect pulses.

Consider an inversion-recovery sequence where the pulses diverge from $\pi$ and $\pi/2$ as would be the case for inhomogeneous coils:

$$2\theta\text{---}\tau\text{---}\theta[\pm x], \text{ acquire signal} \quad [C]$$

Figure 4:
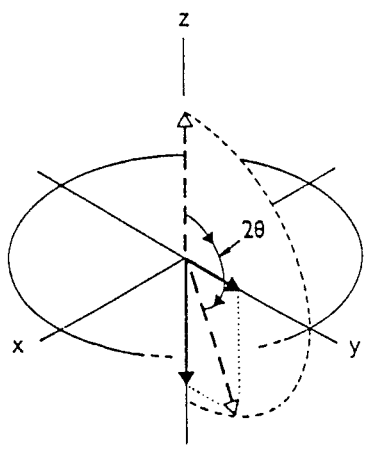
FIG. 4 is a representation of the effect of a $2\theta[x]$ pulse on an initial z axis magnetization.

The situation after the $2\theta$ pulse is shown in FIG. 4. The xy component of magnetization, magnitude $\sin 2\theta$, will process during $\tau$ as a result of chemical shift off-resonance. The $\theta$ pulse will leave a part or all of this vector component in the xy plane, depending on the extent of the prior precession, leading to phase and intensity errors in the final signal. However, from a simple three-dimensional model of the kind shown in FIG. 4 it can be readily seen that for any $\theta$ pulse phase (or any degree of precession of the $\sin 2\theta$ vector) the xy component of the $\sin 2\theta$ vector after the $\theta$ pulse will be the same as when the pulse phase is inverted. After precession of the $\sin 2\theta$ component in the xy plane the action of any pulse, or a pulse of inverse phase, may be viewed respectively as clockwise or anticlockwise rotation of the $\sin 2\theta$ component around the pulse axis. Thus for strong pulses, any pulse or its inverse must leave the same component of the $\sin 2\theta$ vector in the xy plane. Consequently, the accompanying inversion of receiver phase cancels this unwanted xy component as Demco et al found.

The $\cos 2\theta$ component along the $-z$ axis is rotated by the $\theta$ pulse to give an xy component of magnitude $(-\cos 2\theta \sin \theta)$. The phase of this component is inverted if the $\theta$ pulse phase is inverted, so the signal will be accumulated if the receiver phase is also inverted, thus giving a final signal of magnitude proportional to $(-\cos 2\theta \sin \theta)$. This signal magnitude is *independent of* $\rho$.

Figure 5:
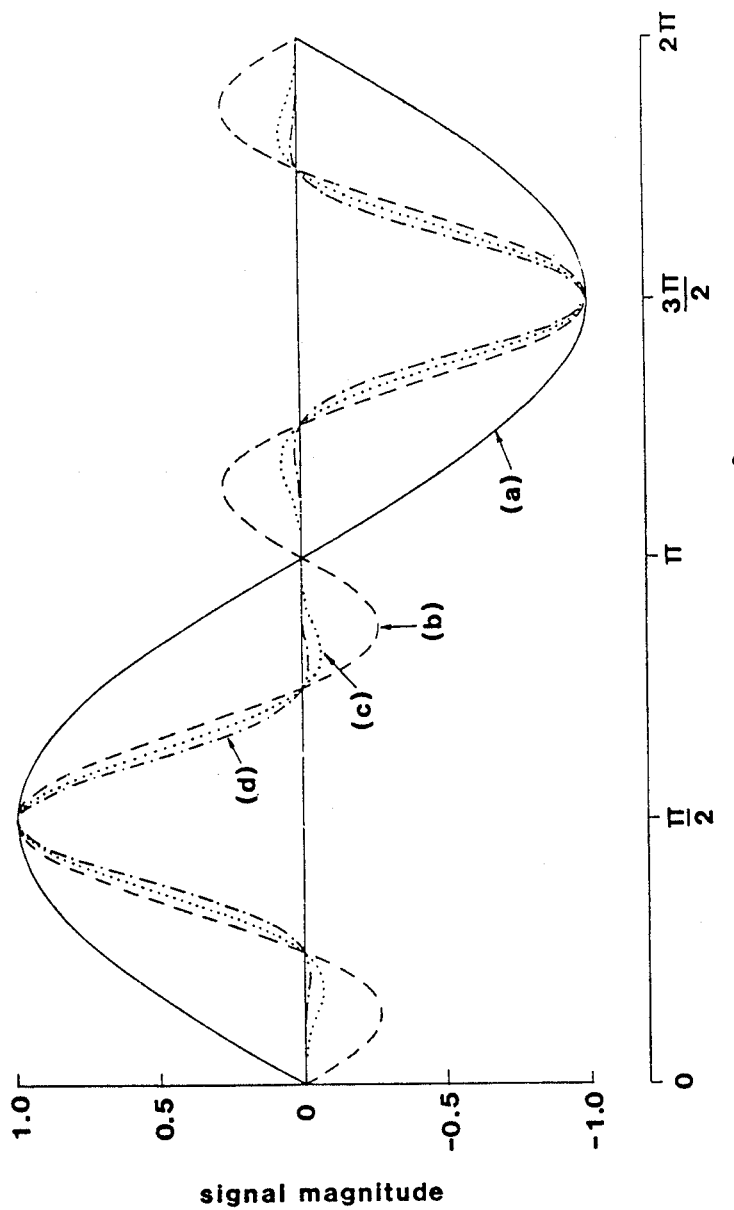
FIG. 5 shows plots of signal magnitude, as a function of the pulse angle $\theta$, following a single radiofrequency pulse and the combined pulses, $2\theta;\theta[\pm x]$ and $2\theta;\theta[\pm x];(2\theta[\pm x, \pm y])_n$, where n=1, 2.

The dependence of $-\cos 2\theta \sin \theta$ on $\theta$ is plotted in FIG. 5(b) for comparison to a single pulse in FIG. 5(a) ($\sin \theta$). The shape of the curve raises the possibility that sequence [C] (with $\rho=0$) might also be used as a depth pulse especially if the negative wings at $0<\theta<45°$ and $135°<\theta<180°$ can be reduced by adding $2\theta[\pm x, \pm y]$ pulses. Provided the $\theta[\pm x]$ phase alternations are independent of the $2\theta[\pm x, \pm y]$ phase cycling, the signal magnitude for the combined pulse $2\theta;\theta[\pm x];(2\theta[\pm x, \pm y])_n$ is $(-\cos 2\theta \sin^{2n+1} \theta)$ and $2 \times 4^n$ pulse phase combinations are required. This magnitude formula is obtained by replacing $\sin \theta$ by $(-\cos 2\theta \sin \theta)$ in the formula given in the previous section for $\theta;(2\theta[\pm x, \pm y])_n$, because the $\theta$ excitation pulse has been replaced by $2\theta;\theta[\pm x]$.

The $\theta$ dependence of the signal magnitude for the combined pulses, $2\theta;\theta[\pm x];2\theta[\pm x, \pm y]$ and $2\theta;\theta[\pm x];(2\theta[\pm x, \pm y])_2$ is shown in FIG. 5(c) and FIG. 5(d) respectively. Clearly the addition of the $2\theta[\pm x, \pm y]$ pulses does reduce the negative wings as hoped. It is counter-productive to add more than two such pulses because the wings are reduced to about 1% of maximum amplitude with two pulses. Furthermore, the improvement gets less with each additional pulse whilst the number of phase combinations increases by a factor of 4.

Figure 6:
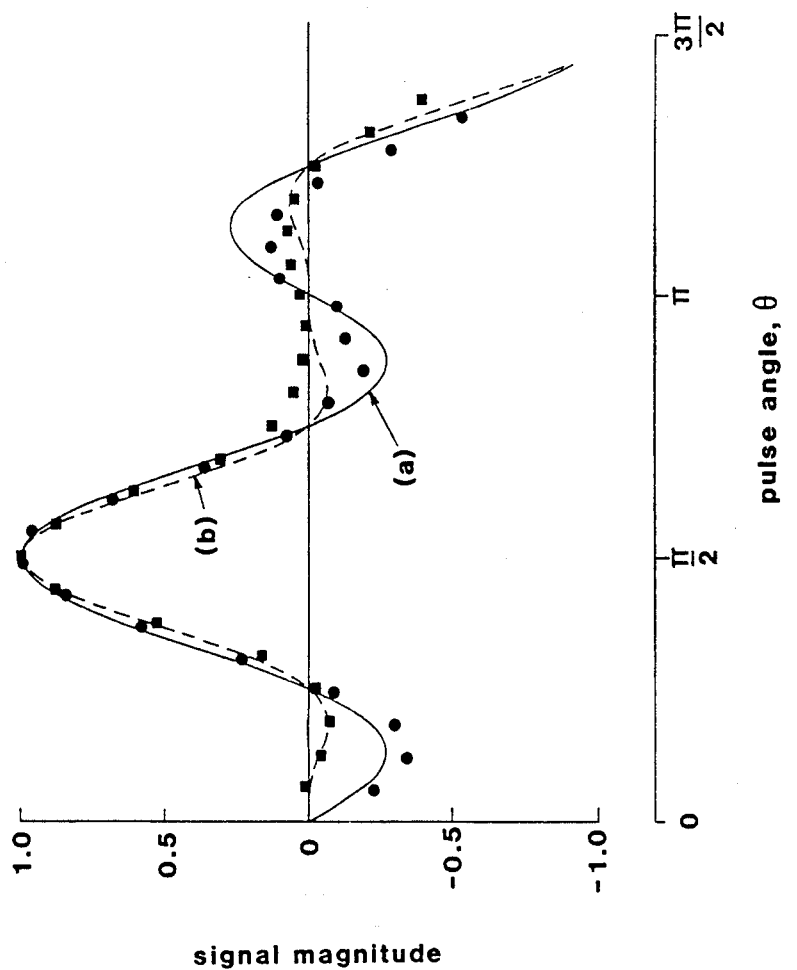
FIG. 6 shows experimental results in comparison to theoretical curves for the combined pulses $2\theta;\theta[\pm x]$ and $2\theta;\theta[\pm x];2\theta[\pm x, \pm y]$.
Figure 7:
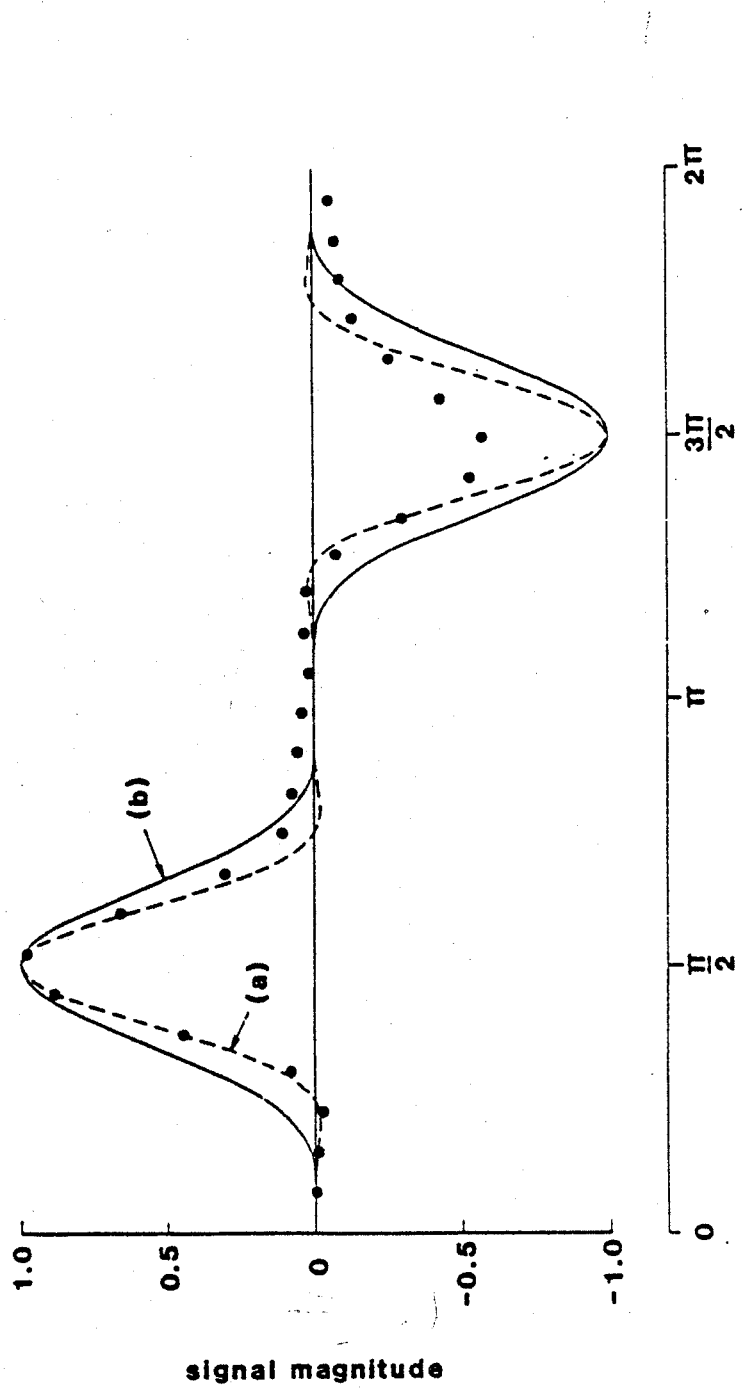
FIG. 7 shows experimental results in comparison to theoretical curves for the depth pulse $2\theta;\theta[\pm x];(2\theta[\pm x, \pm y])_2$.

Experimental verification of the signal magnitude formulae for the combined pulses $2\theta;\theta[\pm x]$ (points) and $2\theta;\theta[\pm x];2\theta[\pm x, \pm y]$ (squares) is shown in FIG. 6 and for $2\theta;\theta[\pm x];(2\theta[\pm x, \pm y])_2$ in FIG. 7. These results were obtained in the same way as described for those in FIG. 3. As before, radiofrequency pulse inhomogeneity becomes more obvious for longer pulses, although the extra discrimination afforded by $2\theta;\theta[\pm x];(2\theta[\pm x, \pm y])_2$ is shown by the near nil signal at $\theta=\pi$ (FIG. 7). As for the depth pulses of the previous section, these combined pulses also show a modest reduction of signal amplitude, when $\theta=\pi/2$, compared to a single $\pi/2$ pulse because of radiofrequency inhomogeneity across the sample. For the spectrometer probe used, the amplitudes were $87.0\pm3.3\%$ ($2\theta;\theta[\pm x]$), $77.2\pm4.4\%$ ($2\theta;\theta[\pm x];2\theta[\pm x, \pm y]$) and $76.7\pm6.9\%$ ($2\theta;\theta[\pm x];(2\theta[\pm x, \pm y])_2$).

The $\theta$ dependence of $\theta;(2\theta[\pm x, \pm y])_2$ is also plotted in FIG. 7 for comparison. Clearly the substitution of $2\theta;\theta[\pm x]$ leads to a substantial improvement with only a factor of two increase in the phase combinations required. The depth pulse $2\theta;\theta[\pm x];(2\theta[\pm x, \pm y])_2$ is the optimum combined pulse, found in this study, for discriminating against sample regions where pulse angles differ from ideal $\pi/2$ and $\pi$ values. To obviate any possibility of ambiguity the phase cycle for this depth pulse is given in Table 1. Note that if a four phase quadrature compensation cycle is used, this must also be achieved independently. That is, the number of phase combinations is four times more than that given in Table 1.

Where it is instrumentally difficult to invert the receiver phase, the equivalent of this may be achieved in either of two ways. Transients from phase combinations requiring receiver phase inversion may be accumulated into a second computer memory block and subtracted from the other half of the total transients at the completion of the acquisition. Alternatively, the inversion of all pulse phases in a phase combination is equivalent to inversion of receiver phase. For example, the first phase combination for the $2\theta;\theta[\pm x];(2\theta[\pm x, \pm y])_2$ pulse in Table 1 which requires inverted receiver phase is $2\theta[x];\theta[x];2\theta[y];2\theta[x]$. Its equivalent is $2\theta[-x];\theta[-x];2\theta[-y];2\theta[-x]$ without receiver phase inversion.

TABLE 1

Relative pulse phases for the depth pulse $\theta;(2\theta[\pm x, \pm y])_2$ [a] and for the last three pulses in the depth pulse, $2\theta;\theta[\pm x];(2\theta[\pm x, \pm y])_2$ [b]

| Receiver | Add (+) | | | Subtract (−) | | |
|---|---|---|---|---|---|---|
| Pulses | $\theta$ | $2\theta$ | $2\theta$ | $\theta$ | $2\theta$ | $2\theta$ |
| Pulse phases | x | x | x | x | y | x |
| | x | −x | x | x | −y | x |
| | x | x | −x | x | y | −x |
| | x | −x | −x | x | −y | −x |
| | x | y | y | x | x | y |
| | x | −y | y | x | −x | y |
| | x | y | −y | x | x | −y |
| | x | −y | −y | x | −x | −y |
| | −x | y | x | −x | x | x |
| | −x | −y | x | −x | −x | x |
| | −x | y | −x | −x | x | −x |
| | −x | −y | −x | −x | −x | −x |
| | −x | x | y | −x | y | y |
| | −x | −x | y | −x | −y | y |
| | −x | x | −y | −x | y | −y |
| | −x | −x | −y | −x | −y | −y |

[a] Top 16 combinations only.
[b] The phase of the first $2\theta$ pulse is not important.

Another alternative, based on the principle that inversion of all pulse phases is equivalent to inversion of receiver phase, may be generated by reconsidering sequence [C] where the $\theta[\pm x]$ alternation is accompanied by inversion of receiver phase. The equivalent of $2\theta[x]$-$\rho$-$\theta[-x]$, acquire with inverted receiver phase is $2\theta[-x]$-$\rho$-$\theta[x]$, acquire with the same receiver phase. Consequently in all the above combined and depth pulses $2\theta;\theta[\pm x]$ may be replaced by $2\theta[\pm x];\theta$ such that the same receiver phase is retained when the $2\theta$ pulse is phase-alternated. Thus we have the depth pulse $2\theta[\pm x];\theta;(2\theta[\pm x,\pm y])_n$ which also gives a signal magnitude of $(-\cos 2\theta \sin^{2n+1}\theta)$ and for which $2 \times 4^n$ pulse phase combinations are required, but inversion of receiver phase is only necessary when the $2\theta$ pulse phases are changed by 90°. Thus for the depth pulse $2\theta[\pm x];\theta;(2\theta[\pm x,\pm y])_n$ the phase combinations are the same as those given in Table 1 where now the $\theta$ column actually shows the phases of the $2\theta$ pulse and where the bottom left-hand quadrant should be swapped for the bottom right-hand quadrant to account for the changed status of the receiver phase. $2\theta;\theta[\pm x]$ may be replaced by $2\theta[\pm x];\theta$ in all the following applications.

OFF-RESONANCE EFFECTS

So far we have ignored the possible effects of pulses being non-ideal when applied off-resonance. A weak off-resonance pulse may be thought of as one which rotates a magnetization vector around an axis which is tilted away from the xy plane towards the z axis, as discussed by Freeman et al, Journal of Magnetic Resonance, 38, 453 (1980). The stronger the pulse (the shorter the $\pi/2$ pulse time), the less the tilt. These tilts complicate the vector model illustrated in FIGS. 1 and 4 and complicate the quantitative analysis of the signal amplitude resulting from the above pulse sequences and depth pulses. Rather than attempt this analysis here we have taken an experimental approach because, provided rf pulses are sufficiently strong, the tilt may be ignored. In the above experimental tests $\pi/2$ pulse times were approximately 30 $\mu$sec and the tests were made across a shift range of $\pm 2,300$ Hz. The lack of any deleterious off-resonance effects, as discussed below, under these severe conditions obviates the need for a detailed analysis.

The experimental signal intensity versus $\theta$ curves in FIGS. 2, 3, 6 and 7 were obtained from the average intensities of four $^{13}$CH$_n$ groups, two close to on-resonance and two at approximately 2,300 Hz off-resonance. All resonances within the spectral width used showed the same intensity dependence on $\theta$ as these four resonances.

Figure 9:
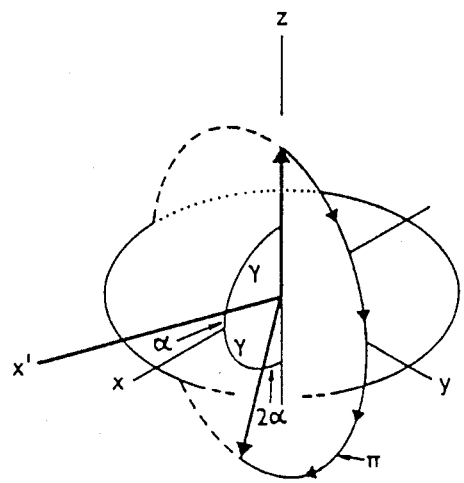
FIG. 9 is a representation of the effect of a weak off-resonance $\pi[x]$ pulse on an initial z axis magnetization.
Figure 10:
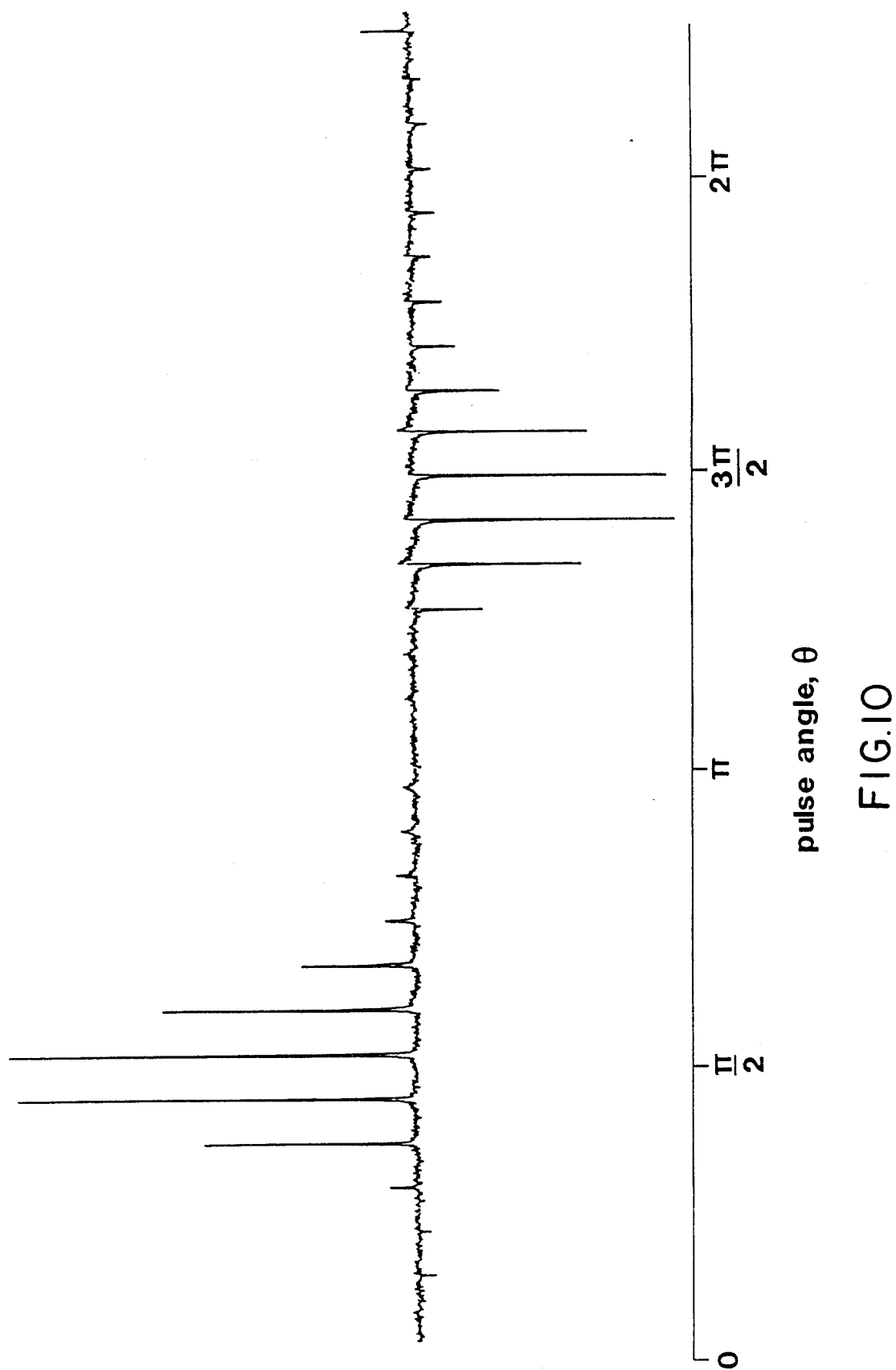
FIG. 10 shows spectra obtained for a cholesterol signal about 2000 Hz upfield of resonance, as a function of the pulse angle $\theta$, for the combined pulse $2\theta;\theta[\pm x];(2\theta[\pm x, \pm y])_2$.

The combined pulse, $2\theta;\theta[\pm x]$ did give a substantial dispersion signal for off-resonance peaks for $\theta$ values around $\pi$. This is illustrated in FIG. 8. These results were obtained in the same way as described for those in FIG. 3. The origin of this dispersion signal, which is 90° out of phase to the normal signal, can be appreciated from FIG. 9. When $\theta=\pi$, the $2\theta$ pulse is a $2\pi$ pulse which rotates the initial magnetization back to its original position even when the pulse is a weak off-resonance one. The subsequent $\pi$ pulse rotates the magnetization vector around the tilted effective field axis, x' (around the surface of a cone, half apex angle, $\gamma=\pi/2-\alpha$) leaving it an angle (2$\alpha$) to the $-z$ axis which is twice the tilt of the effective field. Thus, instead of giving a zero signal, this magnetization has a component of magnitude proportional to sin $2\alpha$ in the xy plane. This component is along the x (or $-x$) axis rather than the $\pm y$ axis for the normal signal (when $\theta=\pi/2$) and thus gives a dispersion signal. Fortunately, experiment also showed that addition of one or more $2\theta[\pm x,\pm y]$ pulses eliminated this error signal. FIG. 10 shows data for $2\theta;\theta[\pm x];(2\theta[\pm x,\pm y])_2$ comparable to FIG. 8. The dispersion signal at $\theta=\pi$ is now absent. It should be remembered that there is no intention of using $2\theta;\theta[\pm x]$ pulses for inhomogeneous coils.

In FIG. 10 small phase errors of a few degrees can be seen for signals when $\theta$ is around $3\pi/2$. Although these errors are hardly larger than random experimental phase errors, they are real and are an off-resonance effect. Errors of opposite phase occur for signals downfield of on-resonance, whereas on-resonance signals shown only random experimental errors. These small phase errors were also observed for resonances far off-resonance when using $\theta;2\theta[\pm x,\pm y]$, $\theta;(2\theta[\pm x,\pm y])_2$ and $2\theta;\theta[\pm x];2\theta[\pm x,\pm y]$ pulses. These small phase errors are not a problem. Any small phase roll such as this across the spectrum would be corrected during the normal phase correction procedure.

The combined pulse $2\theta;\theta[\pm x]$ also gives small intensity differences across a spectrum, even though this difference is not detectable in the $\theta$ dependence of FIG. 6. For example, at $\theta=\pi/2$ eight resonances within $\pm 400$ Hz off-resonance had a signal intensity of $89.8 \pm 0.8\%$ compared to those after a single $\pi/2$ pulse. In comparison, four peaks within $\pm(1600-2300)$ Hz off-resonance had intensities of $81.2 \pm 2.8\%$. No similar significant difference was observed for the $\theta;2\theta[\pm x,\pm y]$ or $\theta;(2\theta[\pm x,\pm y])_2$ pulses although the best depth pulse, $2\theta;\theta[\pm x]; (2\theta[\pm x,\pm y])_2$ did show a difference of about 5% across the spectrum.

These small intensity differences were obtained using pulse power such that the $\pi/2$ pulse length for the sample was about 25 $\mu$sec. A study was made of these intensity differences using longer $\pi/2$ pulse lengths for the depth pulse $2\theta;\theta[\pm x];(2\theta[\pm x,\pm y])_2$. It was found that when $\theta=\pi/2$ the signal intensity fell by 20% when the shift off-resonance was about $1/(16t_\theta)$ Hz and by 50% when the shift off-resonance was about $1/(10t_\theta)$ Hz where $t_\theta$ is the $\theta$ pulse time in seconds. Indeed, the signal intensity as a function of chemical shift has a similar dependence to that of a Gaussin-shaped pulse of the same total length as the depth pulse. Thus, by using high pulse power this intensity variation across the spectrum can be reduced to a minimum, or by using low pulse power the depth pulse can be used as a chemical-shift selective pulse. The latter use, in conjunction with a linear magnetic field gradient, is discussed in a later section.

Finally it should be noted that the off-resonance effects that were observed, or the lack of them, were independent of any $\pi$ delay periods between the individual pulses in these pulse schemes.

THE DEPTH PULSE, $2\theta;\theta[\pm x];(2\theta[\pm x,\pm y])_2$

As an example of the degree of sample discrimination that can be achieved using an inhomogeneous radiofrequency coil, calculations were made for a surface coil starting with the known variation of pulse angle at various distances from the coil (M. W. Garrett, Oak Ridge National Laboratory Publication, ORNL 3575, 8 (1965)). When the $\theta$ pulse angle is 225° at the centre of the coil, it is 90° at 0.9 radii distance from the centre of the coil, on the coil axis. Thus maximum signal intensity arises from nuclei at 0.9 radii depth using a $2\theta;\theta[\pm x];(2\theta[\pm x,\pm y])_2$ pulse. However, the signal intensity is less than 1% of maximum for depths less than 0.6 radii and more than 1.4 radii along the coil axis. In comparison, a single $\theta$ excitation pulse, which is 270° at the coil centre, also produces a maximum signal at 0.9 radii depth along the coil axis. However, the signal intensity only falls to less than 1% of this maximum at depths beyond 2.5 radii. Furthermore, at shallower depths the signal intensity crosses zero intensity at 0.55 radii depth and becomes large and negative at the coil centre, where this negative signal is 2.5 times as large as the positive maximum at 0.9 radii. Clearly, the depth pulse shows good sample discrimination whereas in this case the single $\theta$ pulse shows no discrimination.

It should be noted that the $2\theta$ pulses may be varied from being twice the $\theta$ pulse and from being equal to each other in the depth pulses $\theta;(2\theta[\pm x,\pm y])_n$ and $2\theta;\theta[\pm x];(2\theta[\pm x,\pm y])_n$. For example, for the depth pulse $2\theta_1;\theta[\pm x];2\theta_2[\pm x,\pm y];2\theta_3[\pm x,\pm y]; \ldots ;2\theta_l[\pm x,\pm y]$ the signal intensity is proportional to $-\theta \cos 2\theta_1 \sin \theta \sin^2 \theta_2 \ldots \sin^2 \theta_l$ where the $\theta$ term is included to allow for the different sensitivity of the inhomogenous radiofrequency coil to different sample regions. Relative variation of pulse angles within a depth pulse, such as in this way, will in general result in a reduction of signal intensity from the sample region of interest.

Nevertheless, pulse angles may be varied from the basic combination of $\theta$ and $2\theta$ angles to increase sample discrimination. In this regard, a major problem with using depth pulses with surface coils is that when the $\theta$ pulse length is set to obtain a $\pi/2$ pulse at about 0.9 radii or more depth along the coil's axis, substantial negative signals are obtained from regions close to the coil wire where $\theta \approx 3\pi/2$. This problem gets worse as the depth of the region sampled along the coil's axis is increased, and eventually substantial positive signals are obtained from regions close to the coil wire where $\theta \approx 5\pi/2$. Signals from regions where $\theta$ is close to $3\pi/2$ can be eliminated by varying the $\theta$ pulse relative to the $2\theta$ pulse. For example a suitable method may be written:

$$2\times 2\theta;(\tfrac{2}{3})\theta[\pm x];(2\theta[\pm x,\pm y])_2 + 2\theta;(4/3)\theta[\pm x];(2\theta[\pm x,\pm y])_2$$

indicating that twice as many transients are summed for the depth pulse containing the $(\tfrac{2}{3})\theta$ pulse as for the depth pulse containing the $(4/3)\theta$ pulse. For this method, the dependence of signal intensity is given by $$-\theta \cos 2\theta \sin^4 \theta (2 \sin (\tfrac{2}{3})\theta + \sin (4/3)\theta)/3 \qquad \text{A}$$

which when compared to that of the basic depth pulse, $2\theta;\theta[\pm x];(2\theta[\pm x,\pm y])_2$, shows excellent elimination of the negative signals from regions where $\theta \approx 3\pi/2$ (see Table 2). Both these signals and the positive signals from regions where $\theta \approx 5\pi/3$ can be eliminated using the method written as:

$$2.209\times 2\theta;0.489\theta[\pm x];(2\theta[\pm x,\pm y])_2 + 1.772\times 2\theta;1.082\theta[\pm x];(2\theta[\pm x,\pm y])_2 + 2\theta;0.831\theta[\pm x];(2\theta[\pm x,\pm y])_2 + 0.796\times 2\theta;1.561\theta[\pm x];(2\theta[\pm x,\pm y])_2$$

for which the dependence of signal intensity is given by $$-\theta \cos 2\theta \sin^4 \theta(2.209 \sin 0.489\theta + 1.772 \sin 1.082\theta + \sin 0.831\theta + 0.796 \sin 1.561\theta)/5.777 \qquad \text{B}$$

where the numbers multiplying each term in the summation are either the ratios of the total number of transients obtained for each depth pulse or weighting factors for the summation of equal numbers of transients, or a convenient combination of the two. Again, Table 2 indicates excellent elimination of the $\theta \approx 3\pi/2$ and $5\pi/2$ signals. Both methods only show modest decrease in the signal intensity obtained from regions where $\theta = \pi/2$, method A showing a 13% decrease and method B showing an approx. 18% decrease, the exact decrease depending on the summation method used. These methods have been confirmed experimentally within an accuracy of 2% using a 60 mm diameter surface coil, and a 10 mm diameter, 2 mm thick, $^{31}P$ phantom sample coaxial with the coil, in a Bruker BNT-80 spectrometer.

TABLE 2

Theoretical signal intensities (% of intensity when $\theta = \pi/2$) for incremented values of $\theta$ (degrees) for the "normal" (N) depth pulse $2\theta;\theta[\pm x];(2\theta[\pm x, \pm y])_2$, i.e. $-\theta\cos 2\theta \sin^5\theta$, and for the modified depth-pulse methods, A and B

| $\theta$ | N | A | B |
|---|---|---|---|
| 10 | —[a] | — | — |
| 20 | — | — | — |
| 30 | −0.5 | −0.5 | −0.5 |
| 40 | −0.8 | −0.7 | −0.7 |
| 50 | 2.5 | 2.2 | 2.2 |
| 60 | 16 | 14 | 14 |
| 70 | 44 | 38 | 37 |
| 80 | 77 | 67 | 64 |
| 90 | 100 | 87 | 83 |
| 100 | 97 | 84 | 79 |
| 110 | 69 | 60 | 56 |
| 120 | 32 | 29 | 27 |
| 130 | 6.6 | 6.1 | 5.6 |
| 140 | −3.0 | −2.9 | −2.6 |
| 150 | −2.6 | −2.8 | −2.5 |
| 160 | −0.6 | −0.8 | −0.8 |
| 170 | — | — | — |
| 180 | 0 | 0 | 0 |
| 190 | — | — | — |
| 200 | 0.8 | −0.4 | −0.3 |
| 210 | 3.6 | −0.7 | −0.7 |
| 220 | 4.7 | −0.4 | −0.4 |
| 230 | −12 | 0.5 | 0.5 |
| 240 | −65 | 1.0 | 1.1 |
| 250 | −156 | 0.7 | 1.0 |
| 260 | −251 | 0.1 | 0.2 |
| 270 | −300 | 0 | 0 |
| 280 | −271 | −0.1 | 0.2 |
| 290 | −181 | −0.8 | 0.3 |
| 300 | −81 | −1.3 | 0.2 |
| 310 | −16 | −0.7 | — |
| 320 | 6.8 | 0.6 | — |
| 330 | 5.7 | 1.1 | — |
| 340 | 1.4 | 0.6 | — |
| 350 | — | — | — |
| 360 | 0 | 0 | 0 |
| 370 | — | 0.1 | — |
| 380 | −1.5 | 2.0 | 0.2 |
| 390 | −6.0 | 7.3 | 0.4 |
| 400 | −8.5 | 8.3 | 0.3 |
| 410 | 21 | −19 | −0.6 |
| 420 | 114 | −101 | −2.0 |
| 430 | 268 | −235 | −2.4 |
| 440 | 426 | −369 | −1.3 |
| 450 | 500 | −433 | −0.3 |
| 460 | 445 |  | −1.3 |
| 470 | 293 |  | −3.5 |
| 480 | 130 |  | −4.2 |
| 490 | 25 |  | −1.8 |
| 500 | −11 |  | 1.4 |
| 510 | −8.9 |  | 2.4 |
| 520 | −2.1 |  | 1.1 |
| 530 | — |  | — |
| 540 | 0 |  | 0 |
| 550 | — |  | 0.2 |
| 560 | 2.2 |  | 2.9 |
| 570 | 9.9 |  | 9.8 |
| 580 | 12 |  | 10 |
| 590 | −30 |  | 23 |
| 600 | −162 |  | 114 |
| 610 | −380 |  | 250 |
| 620 | −600 |  | 370 |
| 630 | −700 |  | 406 |
| 640 | −620 |  | 336 |
| 650 | −405 |  | 203 |
| 660 | −179 |  | 81 |

[a]Entries given as "—" are less than 0.1.

Although methods A and B may be the most convenient combinations of pulse angles for the purpose of eliminating the $\theta \approx 3\pi/2$; $5\pi/2$ signals, they are not the only possible combinations and other variations for other purposes, are included within the scope of this invention.

INVERSION RECOVERY $T_1$ MEASUREMENTS

Experiments were conducted to test whether the sequence, sequence [D]

$$2\theta - \rho - \theta[\pm x];(2\theta[\pm x, \pm y])_2, \text{ acquire signal} \qquad [D]$$

will be useful for accurate $T_1$ measurements when using inhomogeneous coils such as surface coils. From the foregoing theory, at particular values of $\theta$, the signal intensity should vary between $\cos 2\theta \sin^5 \theta$, at small $\rho$ values, and $\sin^5 \theta$ at $\rho$ values considerably longer than the relaxation time. The recovery from the inverted, $\cos 2\theta \sin^5 \theta$, signal to the $\sin^5 \theta$ signal should follow the normal exponential ($e^{-\rho/T_1}$) form. If $\theta = \pi/2$ the signal intensity is intially $-1$ units, and this recovers to $+1$ units at long $\rho$ times in the same way as for a normal inversion-recovery sequence. The total intensity change is thus 2 units. For surface or other inhomogeneous coils where $\theta$ might take all values, the total signal intensity change from a particular sample region will be $(-\cos 2\theta \sin^5 \theta + \sin^5 \theta)$, and thus its relative contribution to the total signal is $\frac{1}{2}(-\cos 2\theta \sin^5 \theta + \sin^5 \theta)$. Consequently the depth characteristics of sequence [D] are given by the average of the $\theta$ dependence curves for $2\theta;\theta[\pm x];(2\theta[\pm x, \pm y])_2$ and $\theta;(2\theta[\pm, \pm y])_2$, i.e. the average of FIG. 2(c) and FIG. 5(d) or the average of FIGS. 7(a) and 7(b). Thus sequence [D] will show slightly degraded sample discrimination compared to a $2\theta;\theta[\pm x];(2\theta[\pm x, \pm y])_2$ depth pulse. Considering the lack of any major off-resonance effects for the pulses $\theta;(2\theta[\pm x, \pm y])_2$ and $2\theta;\theta[\pm x];(2\theta[\pm x, \pm y])_2$ (as discussed above), $T_1$ measurements using sequence [D] are also expected not to be affected in any major way by off-resonance effects.

To test sequence [D], $T_1$ measurements were conducted on twelve well-resolved signals in the cholesterol spectrum, whose $T_1$'s varied between 0.3–0.6 sec, and which were up to 1500 Hz off-resonance. $T_1$'s were measured using sequence [D] with $\theta = \pi/2$ and with the normal, $\pi-\rho-\pi/2[\pm x]$, sequence. The average ratio of the sequence [D] measurements to the normal measurements was $1.01 \pm 0.02$. The sequence [D] measurements were repeated with the $\theta$ pulse time reduced to 53°, giving an average ratio of $1.04 \pm 0.12$. The latter represents a successful stringent test of the method. The larger standard deviation of the average, results from the smaller limits of signal variation (given by $\frac{1}{2}(-\cos 2\theta \sin^5 \theta + \sin^5 \theta)$) at this reduced $\theta$ value. This variation is only 0.2 of that when $\theta = \pi/2$ and consequently 25 times more transients would need to be accumulated to obtain the same accuracy of measurement. No deleterious off-resonance effects were observed (e.g. no phase errors).

The two experiments are equivalent to the measurement of $T_1$ values of two phantom samples using a surface coil for which the initial inversion pulse is 180° and 106°. The constant phase characteristics found for off-resonance signals, as illustrated in FIG. 10, guarantee that the signals from two such phantoms would add coherently.

SPIN-ECHO METHODS

The depth pulse, $2\theta;\theta[\pm x];(2\theta[\pm x, \pm y])_2$, may be extended for use as a spin-echo sequence by placing one or both of the $2\theta[\pm x, \pm y]$ pulses at the centre or centres of the spin-echo delay $\rho$ periods. For example, $-\rho-2\theta[\pm x, \pm y]-\rho$ or $-\rho/2-2\theta[\pm x, \pm y]-\rho-2\theta[\pm x, \pm y]-\rho/2$ are possibilities. However, only one such pulse is required during the $\rho$ periods and nothing is gained by using both. Consequently the basic spin-echo sequence is $$2\theta;\theta[\pm x];2\theta[\pm x, \pm y]-\rho-2\theta[\pm x, \pm y]-\rho- \text{ acquire signal} \qquad [E]$$

The depth characteristics of this sequence are unchanged by the $\rho$ periods and so that $\theta$ dependence is given by $-\cos 2\theta \sin^5 \theta$ (FIG. 5(d) or 7(a)). The magnetization vector component accumulated using the sequence is affected by the last $2\theta[\pm x, \pm y]$ pulse as though it were a perfect $\pi$ pulse. Consequently, any coherent precession of magnetization vectors in the xy plane of the rotating reference frame during $\rho$, is refocused by this pulse. Thus, for example, chemical shift off-resonance, heteronuclear coupling and $B_0$ inhomogeneity is refocused and eliminated from the $\rho$ delay period. This enables application of some multipulse techniques using inhomogeneous radiofrequency coils. Some heteronuclear examples follow.

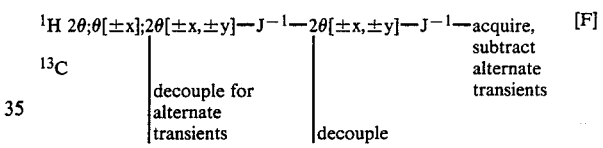

Sequence [F] would provide a $^1H$ spectrum of only those $^1H$ nuclei directly bonded to $^{13}C$ nuclei. J is the single-bond $^1H-^{13}C$ coupling constant. Sequence [F] should be extremely useful in in vivo $^{13}C$ enrichment studies.

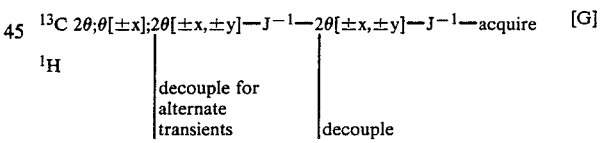

The simple spin-echo equivalent of sequence [G] has found widespread use in high resolution liquid state NMR for editing $^{13}C$ spectra. Addition of alternate transients yields a methylene/quaternary subspectrum and subtraction yields a methyl/methine subspectrum. The former can be separated into methylene and quaternary subspectra by obtaining a quaternary/$\frac{1}{3}$ methylene subspectrum using sequence [H]. These sequences will also be useful in $^{13}C$ NMR of whole animals and humans.

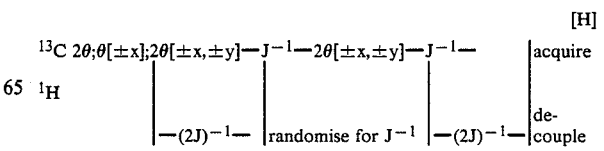

DEPTH PULSES AS PART OF LOCALIZATION SCHEMES

Figure 11:
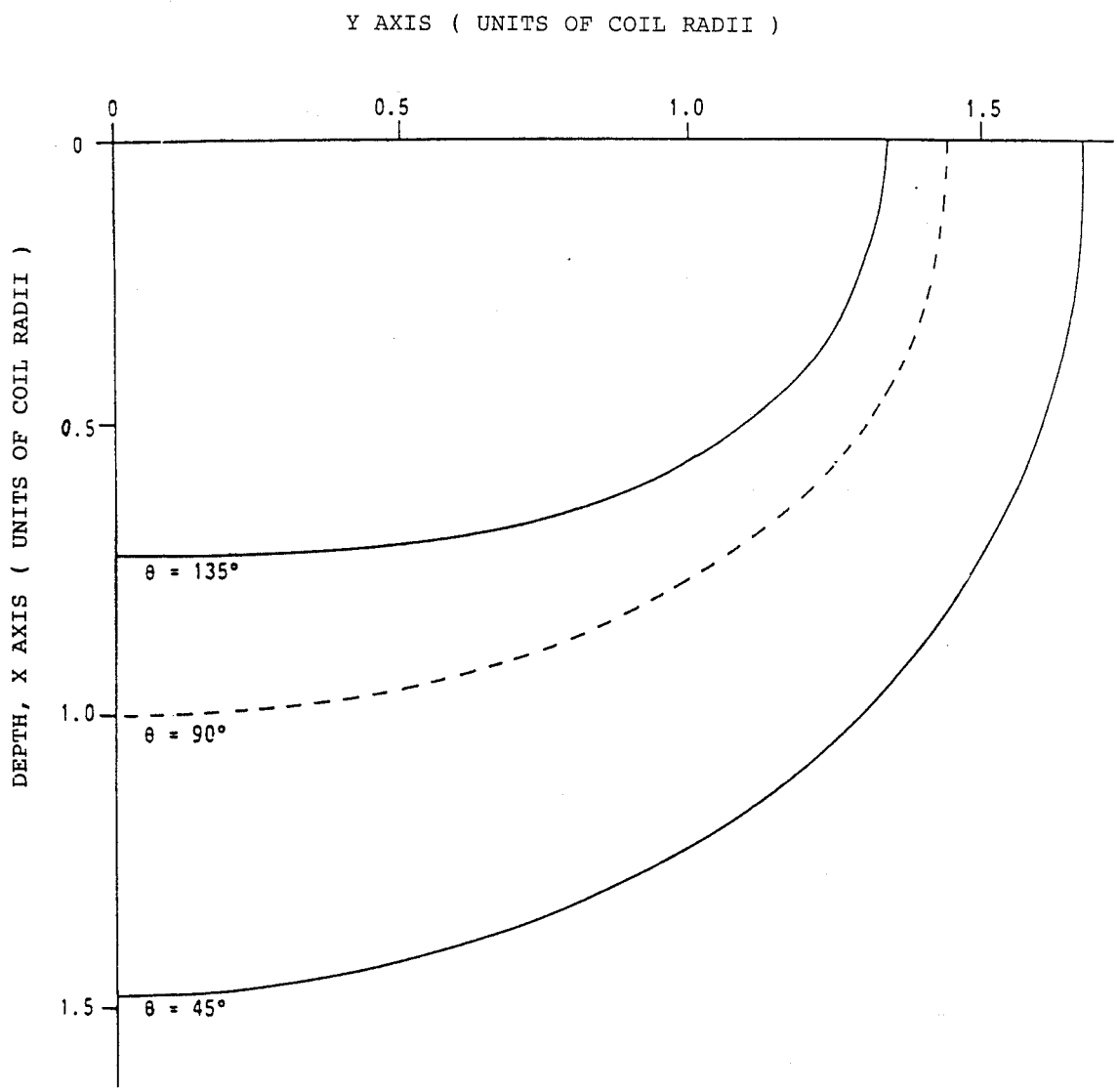
FIG. 11 shows the depth-pulse sensitive region in the xy plane defined by $45° < \theta < 135°$ generated by a surface coil, where $\theta$ has been set to $\pi/2$ radians at 1.0 radius depth.

It has been shown that depth pulses can be used to discriminate against sample regions where the pulse angle $\theta$ differs widely from $\pi/2$. This will be of use in animal or human NMR studies of metabolism where it is necessary to obtain an NMR spectrum from particular regions, e.g. particular organs or muscles. A convenient means of obtaining signals from a selected region, with good sensitivity, is to place a surface radiofrequency coil as near as possible to this region on the surface of the animal. As noted above, the poor sample discrimination afforded by the surface coil is improved dramatically when used in conjunction with depth pulses, but the sensitive region generated by depth pulses is poorly shaped for animal/surface coil studies. This is illustrated in FIG. 11 where the sensitive region defined by $45° < \theta < 135°$, and $\theta = \pi/2$ at 1.0 radius depth, has been drawn for a surface coil from calculations obtained from M. W. Garrett, Oak Ridge National Laboratory Publication, ORNL 3575, 8 (1965). Although this sensitive region is at a uniform depth from the surface coil for off-axis distances of up to 0.7 radii, it curves back into the sample surface for larger off-axis distances and crosses the surface outside the coil. To be most useful, signals from regions closer to the sample surface need to be eliminated. There are a number of ways of doing this.

First, profiling coils as described by P. E. Hanley and R. E. Gordon, Journal of Magnetic Resonance, 45, 520 (1981) may be used to generate non-linear magnetic field gradients, and thus a roughly spherical region of homogeneous magnetic field, overlapping the depth pulse sensitive region along the surface coil's axis, thus excluding the depth pulse sensitive region at shallower depth. The depth pulses will eliminate a large part of the broad signals from sample regions where the magnetic field homogeneity has been purposely degraded by the non-linear field gradients of the profiling method.

Second, as noted in a previous section the depth pulse $2\theta;\theta[\pm x];(2\theta[\pm x,\pm y])_2$ acts as a good chemical shift selective pulse. Experimental tests show that this depth pulse still functions normally in discriminating against regions where $\theta$ differs markedly from $m\pi/2$ (m an odd integer) for all frequencies within the selected chemical shift window. Thus, additional sample localization can be achieved by applying the depth pulse in a linear magnetic field gradient. If the field gradient is along the surface coil's axis, with the gradient zero centred at the middle of the depth-pulse sensitive region, depth-pulse signals from shallower depths are excluded. Provided the field gradient is switched off during signal acquisition, a high resolution spectrum can be obtained from the fully localized sample region. It is convenient to apply a spin-locking pulse whilst switching off the gradient to preserve the xy magnetization which is to be detected. Experimental results obtained with a phantom sample, illustrating the viability of this method, are given in Table 3.

Third, as noted above, spin-echo delays can be inserted in any of the depth pulses. Thus depth pulses can be used in conjunction with the method of J. C. Haselgrove et al, Science, 220 1170 (1983) whereby a linear magnetic field gradient is switched on for one half of a spin-echo and this field gradient is incremented for a series of spectra. If incremented in one direction, one dimensional imaging is obtained. If independently incremented in two directions, two dimensional imaging is obtained, and so on. Thus, for example, the incremented gradient can be applied along the surface coil's axis enabling imaging in that dimension and thus elimination of depth pulse signals from shallow depths. Alternatively the field gradient could be incremented in the two orthogonal directions parallel to the plane of the coil, thus enabling the depth pulse sensitive region to be divided up into a two dimensional array of sample compartments.

TABLE 3

Relative signal intensities (%) obtained from a phantom sample (10 mm diameter, 2 mm thick), located at various positions relative to a 30 mm radius surface coil, by applying the depth pulse, $2\theta;\theta[\pm x];(2\theta[\pm x, \pm y])_2$ in the absence and presence of a magnetic field gradient along the coil's axis (x axis).[a]

| depth (mm) (x axis) | distance (mm) along axis 45° to y and z axes | | | | | | | | | |
|---|---|---|---|---|---|---|---|---|---|---|
| | 0 | 10 | 20 | 30 | 40 | 0 | 10 | 20 | 30 | 40 |
| | field gradient absent | | | | | field gradient present | | | | |
| 0 | −94 | −48 | −9 | −94 | −12 | 5 | x | x | x | x |
| 2.5 | −218 | −181 | −183 | −103 | 42 | x | x | x | x | x |
| 7.5 | −127 | −127 | −55 | x | 86 | x | x | x | x | x |
| 12.5 | x | x | x | 41 | 44 | x | x | x | x | x |
| 17.5 | −3 | x | 20 | 97 | 11 | x | x | x | x | x |
| 22.5 | 42 | 50 | 100 | 70 | x | 42 | 39 | 73 | 23 | x |
| 27.5 | 88 | 100 | 97 | 18 | | 82 | 100 | 85 | 14 | x |
| 32.5 | 56 | 56 | 28 | x | | 14 | 15 | 5 | x | x |

[a]Measurements were made on a neat trimethylphosphate phantom at a $^{31}$P frequency of 32.4 MHz using a BNT-80 spectrometer and a $\theta$ pulse length of 100 μsec. The field gradient was 340 Hz/mm.
x Signal intensity less than noise level, i.e. <5%.

Fourth, instead of using magnetic field gradients to eliminate the depth-pulse signals at shallow depth, multiple radiofrequency coils may be used. For example a large irradiation surface coil may be used to generate the sensitive region and a smaller coplanar coaxial detection surface coil may be used to discriminate, on the basis of low sensitivity, against the shallow sensitive region which is furthest away from the small coil. For example, using the depth pulse $2\theta;\theta[\pm x];(2\theta[\pm x,\pm y])_2$ signal intensity is proportional to $-\phi \cos 2\theta \sin^5 \theta$ where $\phi$ represents the distribution of pulse angles if a pulse were delivered by the small coil and so is a measure of the sensitivity of the small coil. To avoid coupling between the two coils it is necessary to have the small coil detuned whilst the pulses are applied with the large coil, and the large coil detuned whilst the signal is detected by the small coil. Experimental results proving the viability of the method are given in Table 4. This double coil method may be improved by applying some pulses with one coil and some with the other. For example, if signal detection was done with the large coil, and $\theta$ pulses were applied with the large coil and $\phi$ pulses with the small coil, then for the depth pulse, $2\theta;\theta[\pm x];2\theta[\pm x,\pm y];(2\phi[\pm x',\pm y'])_2$, signal intensity would be proportional to $-\theta \cos\theta \sin^3\theta \sin^4\phi$. (x' and y' indicate that $\phi$ pulse phases will generally be different from $\theta$ pulse phases). This means that signal would only be accumulated from where the sensitive regions of both coils overlap. By suitable design and pulse calibration this region of overlap can be restricted to within suitable depth limits.

Finally, it should be noted that the above are merely examples, and included within the scope of this invention are any localization methods which utilise depth pulses to achieve part of the sample discrimination and that these methods may include radiofrequency coils other than surface coils, and may include samples other than of animal or human origin. Furthermore, whenever depth pulses are used, spin-echo applications and $T_1$ measurements may be made by suitable insertion of delay periods within the depth-pulse schemes.

upwards by an angle $\alpha$ from the xy plane of the rotating reference frame is $$f(\theta[\beta],\alpha) = \begin{bmatrix} \sin^2\beta \cos\theta^1 + \cos^2\beta(\cos^2\alpha + \sin^2\alpha \cos\theta^1) & \sin\alpha \sin\theta^1 & \sin\beta \cos\alpha \sin\theta^1 \\ -\sin2\beta \cos^2\alpha \sin^2(\theta^1/2) & -\sin2\beta \cos^2\alpha \sin^2(\theta^1/2) & +\cos\beta \sin2\alpha \sin^2(\theta^1/2) \\ -\sin\alpha \sin\theta^1 & \cos^2\beta \cos\theta^1 & \cos\beta \cos\alpha \sin\theta^1 \\ -\sin2\beta \cos^2\alpha \sin^2(\theta^1/2) & +\sin^2\beta(\cos^2\alpha + \sin^2\alpha \cos\theta^1) & -\sin\beta \sin2\alpha \sin^2(\theta^1/2) \\ -\sin\beta \cos\alpha \sin\theta^1 & -\cos\beta \cos\alpha \sin\theta^1 & \sin^2\alpha + \cos^2\alpha \cos\theta^1 \\ +\cos\beta \sin2\alpha \sin^2(\theta^1/2) & -\sin\beta \sin2\alpha \sin^2(\theta^1/2) & \end{bmatrix} \quad [1]$$

The convention used here and in the preceding descriptions is that clockwise rotations are positive and the x axis is clockwise of y when looking along z towards the origin.

As described in the above-mentioned published articles, the cycle matrix for a $2\theta[\pm x]$ phase-cycled pulse is given by $$2\times f(2\theta[\pm x],\alpha) = f(2\theta[x],\alpha) + f(2\theta[-x],\alpha), \quad [2]$$

and so $$f(2\theta[\pm x],\alpha) = \begin{bmatrix} \cos^2\alpha + \sin^2\alpha\cos2\theta' & \sin\alpha\sin2\theta' & 0 \\ -\sin\alpha\sin2\theta' & \cos2\theta' & 0 \\ 0 & 0 & \sin^2\alpha + \cos^2\alpha\cos2\theta' \end{bmatrix} \quad [3]$$

TABLE 4

Relative signal intensities (%) obtained from a phantom sample (10 mm diameter, 2 mm thick), located at various positions relative to the surface coils, by applying the depth pulse, $2\theta;\theta[\pm x];(2\theta[\pm x, \pm y])_2$, with a 30 mm radius coil and detecting the signal with a coaxial, coplanar coil of 10 mm radius.[a]

| depth (mm) (x axis) | distance (mm) along y axis (z = 0) | | | | | | distance (mm) along z axis (y = 0) | | | | distance (mm) along axis 45° to y & z axes | | | |
|---|---|---|---|---|---|---|---|---|---|---|---|---|---|---|
| | 0 | 10 | 20 | 30 | 40 | 50 | 10 | 20 | 30 | 40 | 20 | 30 | 40 | 50 |
| 0 | -11 | x | x | x | x | 6 | x | x | x | x | x | x | 18 | x |
| 3 | -5 | x | x | x | 12 | x | x | x | 5 | x | x | 5 | 16 | |
| 6 | 12 | x | x | x | 16 | x | x | 5 | 7 | x | x | 20 | 7 | |
| 9 | 57 | 34 | 25 | 29 | 11 | x | 39 | 28 | 6 | x | 34 | 30 | x | |
| 12 | 89 | 71 | 54 | 29 | 9 | x | 70 | 41 | x | | 54 | 23 | | |
| 15 | 100 | 79 | 50 | 19 | x | | 77 | 32 | x | | 46 | 9 | | |
| 18 | 71 | 55 | 29 | 7 | | | 46 | 14 | x | | 9 | x | | |
| 21 | 39 | 27 | 13 | x | | | 23 | x | | | x | | | |
| 24 | 17 | 5 | x | | | | x | | | | | | | |
| 27 | 5 | x | | | | | | | | | | | | |
| 30 | x | | | | | | | | | | | | | |

[a]Measurements were made on a neat trimethylphosphate phantom at a $^{31}$P frequency of 32.4 MHz using a BNT-80 spectrometer and a $\theta$ pulse length of 30 $\mu$sec. The z axis is parallel to the main magnetic field.
x Signal intensity less than noise level, i.e. <4%.

GENERAL MATHEMATICAL DESCRIPTION OF PHASE CYCLING SCHEMES

Bendall and Pegg (Journal of Magnetic Resonance in Medicine, 2, 91–113 (1985)) have introduced a convenient way of mathematically describing phase-alternated pulses (also called phase-"cycled" pulses) in terms of a linear combination of rotation matrices. The rotation matrices for each individual pulse phase, which describe the action of the pulse on x,y and z magnetization, are summed to give a final matrix, called a "cycle" matrix, which fully describes the effect of a phase-cycled pulse on the final NMR signal detected from the sample. Bendall and Pegg (Journal of Magnetic Resonance, 63, 494–503 (1985)) have shown that the matrix for a pulse of angle $\theta$, about an axis which is rotated through a (phase) angle $\beta$ from the x-axis and is tilted It follows that the cycle matrix for a $2\theta[\pm x, \pm y]$ phase-cycled pulse is given by $$2\times f(2\theta[\pm x, \pm y],\alpha) = f(2\theta[\pm x],\alpha) - f(2\theta[\pm y], \alpha), \quad [4]$$

and so $$f(2\theta[\pm x,\pm y],\alpha) = \cos^2\alpha\sin^2\theta' \begin{bmatrix} 1 & 0 & 0 \\ 0 & -1 & 0 \\ 0 & 0 & 0 \end{bmatrix} \quad [5]$$

Equations [1] to [5] exactly determine the effect of the phase-cycled pulses both on and off-resonance, since the equations include the off-resonance tilt angle α and the increased pulse angle θ', where $$\tan \alpha = 4\Delta H t_{90} \text{ and } \theta' = \theta \sec \alpha, \quad [6]$$

where ΔH(Hz) is the resonance offset and $t_{90}$ is the on-resonance 90° pulse time in seconds. In practice, these theoretical equations coincide within experimental error to the off-resonance effects discussed in preceding sections of this specification.

The 2θ[±x,±y] phase-cycled pulse represents a preferred embodiment of the invention, and there are an infinite number of equivalent forms of this phase-cycling procedure. For example, instead of four 90° phase shifts, eight 45° phase shifts could be used with suitable cycling of receiver phase. Indeed, phase shifts which are in general equal to 360°/m, where m is an integer greater than two, might be used. Another fairly simple example is with m equal to three. The phase of the pulse is phase-cycled through all three 120° phase shifts, 0,120 and 240°, and this necessitates a concurrent cycling of receiver phase as 0,240 and 120° respectively (a more complicated and technically demanding form of cycling than the inversion of receiver phase required for 2θ[±x,±y]). The cycle matrix for this 2θ[0,120,240°] pulse (m=3) is given by $$3 \times f(2\theta[0,120,240°],\alpha) = f(\theta[0°],\alpha) + f(120°[z]) \times f(\theta[120°],\alpha) + f(240°[z]) \times f(\theta[240°],\alpha), \quad [7]$$

where the f(θ[z]) matrices in the linear combination of [7] account for the cycling of the receiver phase, where $$f(\theta[z]) = \begin{bmatrix} 1 & 0 & 0 \\ 0 & \cos\theta & \sin\theta \\ 0 & -\sin\theta & \cos\theta \end{bmatrix}. \quad [8]$$

Thus $$f(2\theta[0,120,240°],\alpha) = \cos^2\alpha \sin^2\theta' \begin{bmatrix} 1 & 0 & 0 \\ 0 & -1 & 0 \\ 0 & 0 & \frac{\sin^2\alpha + \cos^2\alpha\cos 2\theta'}{\cos^2\alpha \sin^2\theta'} \end{bmatrix} \quad [9]$$

Cycle matrix [9] for a 2θ[0,120,240°] pulse is identical to cycle matrix [5] for the preferred 2θ[±x,±y] phase-cycled pulse, except for the extra $f_{zz}$ term in [9]. However, the $f_{zz}$ term determines how z magnetization is modified by the pulse, a facet which plays no part in the use of the pulse in depth pulse sequences. Thus a 2θ[0,120,240°] phase-cycled pulse gives an equivalent result to 2θ[±x,±y]. Not all values of m will work, but for all effective values a cycle matrix the same as [5] is obtained except for the redundant $f_{zz}$ term. In such cases for m>4, the same result is obtained but with a more extensive phase cycle which takes additional signal acquisition time for no advantage. For m=3 a more technically demanding and complex list of pulse and receiver phases is required so again no advantage is gained over 2θ[±x,±y].

Radiofrequency pulses may be of constant phase with amplitude represented by a square envelope, in which case they are simple radiofrequency pulses, or they may be complex pulses with shaped amplitudes and with the Rf phase or frequency varying during the pulse. The Rf phase may be changed by a few increments during the pulse in which case the pulse is said to be a composite pulse. Whatever the nature of the Rf pulse, at any particular resonance offset the action of the pulse can be represented by matrix [1]. It follows that the phase cycling described herein is effective for any Rf pulse whether simple, shaped, complex or composite.

In the foregoing it has been shown for an NMR experiment that alternation of a 2θ pulse through all four 90° phase shifts, as described by Bodenhausen et al, subsequent to a θ pulse may be used to select some sample regions and discriminate against others when the pulses are applied with an inhomogeneous radiofrequency coil. This represents a new use of a known process.

In addition it has been shown that this sample discrimination can be further improved by addition of more phase-alternated pulses and by pre-application of a 2θ pulse accompanied by suitable phase alternation of the θ pulse. These combined pulses, or depth pulses, written as $\theta;(2\theta[\pm x,\pm y])_n$ and $2\theta;\theta[\pm x];(2\theta[\pm x,\pm y])_n$ represent entirely new processes. Further discrimination may be obtained by changing some of the pulse angles within these depth pulses from the θ:2θ ratio. The 2θ[±x,±y] phase-cycled pulse represents a preferred embodiment of the invention. Equivalent phase cycles through m shifts of 360°/m, where m is an integer greater than two, are possible.

Also it has been shown that these combined pulses may be used for spin-echo techniques by placing one or more of the 2θ[±x,±y] pulses at the centre or centres of the spin-echo delay periods, although it is only necessary to use one such pulse as a refocusing pulse. It has also been shown that $2\theta;\theta[\pm x];(2\theta[\pm x,\pm y])_n$ may be used for inversion-recovery $T_1$ measurements by inserting an incremented relaxation delay period after the first 2θ pulse.

Furthermore, by example, it has been shown that these combined, or depth, pulses may be used in conjunction with other methods such as static or pulsed magnetic field gradients, or multiple radiofrequency coils, to achieve complete sample localization.

The various phase-cycling procedures may be readily utilised with Rf pulses of composite or shaped form, or any other form of complex Rf pulse.

A quadrature phase compensation scheme may be employed in any of the schemes in accordance with the invention.

The methods in accordance with the invention may be carried out on any suitably equipped and programmed apparatus, and in accordance with a further aspect of the invention, there is provided apparatus for obtaining a NMR spectrum from a sample comprising means for generating a static magnetic field, a support for supporting the sample in the static magnetic field, means for generating a plurality of radiofrequency pulses as specified above, a radiofrequency irradiation coil adjacent to the sample support having an inhomogeneous radiofrequency field in the intended region of the sample, means for applying the plurality of pulse sequences to the coil, and means for detecting an NMR signal from a sample supported by the sample support.

The apparatus according to the invention can be utilised for, for example, sensitive volume localization using multiple rf coils and/or pulsed or static field gradients, inversion-recovery $T_1$ measurements and spin-echo techniques. In addition, quadrature phase compensation may be added to the phase cycling used for the depth pulses, and in substituents for receiver phase inversion all the phases for a depth pulse transient may be inverted.

While the invention has been particularly shown and described with reference to a preferred embodiment thereof, it will be understood by those skilled in the art that the foregoing and other changes in form and details may be made therein without departing from the spirit and scope of the invention.

In the claims, terms are used which are defined in the foregoing specification or in the references referred to above.

What is claimed is:

1. A method of obtaining a localized nuclear magnetic resonance spectrum from a sample using a radiofrequency irradiation coil which provides an inhomogeneous radiofrequency field, which method comprises applying to the sample a plurality of radiofrequency pulse sequences, each pulse sequence including an excitation pulse, and at least one other pulse, the pulse sequences differing only in the phase of one or more of the said at least one other pulse, and the phases of at least one of the said at least one other pulse being cycled through all m phase shifts of 360 degrees/m in selected sequences of the said plurality where m is an integer greater than two, the number of sequences in the said plurality being such that a sequence exists for each possible combination of the said phase shifts for each said at least one other pulse, acquiring an NMR signal after each pulse sequence, and combining the NMR signals obtained to produce a localized NMR signal from selected regions of the sample.

2. A method in accordance with claim 1, wherein the relative pulse angles of at least one of the said at least one other pulse are varied from being twice as large as the first pulse.

3. A method in accordance with claim 1, wherein the phase of all pulses of any sequence which requires inversion of the receiver phase is inverted, and the same receiver phase is used for all signal acquisitions.

4. A method in accordance with claim 1, wherein a spin-echo technique or inversion-recovery $T_1$ measurement is carried out on the sample.

5. A method in accordance with claim 1, wherein at least one delay is provided between two or more of the said radiofrequency pulses.

6. A method in accordance with claim 5, wherein a pulsed magnetic field gradient is applied to the sample during a said delay period.

7. A method in accordance with claim 1, wherein at least one magnetic field gradient is applied to the sample during the application of a radiofrequency pulse.

8. A method in accordance with claim 1, wherein radiofrequency pulses are applied with a first radiofrequency coil and signal acquisition is carried out using a second radiofrequency coil.

9. A method in accordance with claim 1, wherein some radiofrequency pulses are applied with a first radiofrequency coil and the remaining radiofrequency pulses are applied with one or more other radiofrequency coils.

10. A method in accordance with claim 1, wherein one or more of the radiofrequency pulses is a complex radiofrequency pulse.

11. A method in accordance with claim 10, wherein the complex pulse is a composite or shaped pulse.

12. A method of analyzing a sample by pulsed nuclear magnetic resonance using a radiofrequency irradiation and detection coil which provides an inhomogeneous radiofrequency field, comprising reducing nuclear magnetic resonance signals from regions where a single radiofrequency pulse angle differs from $\pi/2$ radians by applying a second pulse after a first pulse prior to signal detection by a receiver, wherein the second pulse has a pulse angle twice as large as the pulse angle of the first pulse and the phase of the second pulse is alternated through all four 90 degree phase shifts during subsequent transients such that an equal number of transients are acquired for each of the four phase shifts, and wherein the receiver phase is inverted when the phase of the second pulse is shifted +90 degrees or −90 degrees relative to the phase of the second pulse used for the first transient and wherein the relative pulse angles of at least one pulse other than said first pulse is varied from being twice as large as the first pulse.

13. A method of analyzing a sample by pulsed nuclear magnetic resonance using a radiofrequency irradiation and detection coil which provides an inhomogeneous radiofrequency field, comprising reducing nuclear magnetic resonance signals from regions where a single radiofrequency pulse angle differs from $\pi/2$ radians by applying a second pulse after a first pulse prior to signal detection by a receiver, wherein the second pulse has a pulse angle twice as large as the pulse angle of the first pulse and the phase of the second pulse is alternated through all four 90 degree phase shifts during subsequent transients such that an equal number of transients are acquired for each of the four phase shifts, and wherein the receiver phase is inverted when the phase of the second pulse is shifted +90 degrees or −90 degrees relative to the phase of the second pulse used for the first transient and wherein the phase of all pulses of any sequence which requires inversion of the receiver phase is inverted, and the same receiver phase is used for all signal acquisitions.

14. A method of analyzing a sample by pulsed nuclear magnetic resonance using a radiofrequency irradiation and detection coil which provides an inhomogeneous radiofrequency field, comprising reducing nuclear magnetic resonance signals from regions where a single radiofrequency pulse angle differs from $\pi/2$ radians by applying a second pulse after a first pulse prior to signal detection by a receiver, wherein the second pulse has a pulse angle twice as large as the pulse angle of the first pulse and the phase of the second pulse is alternated through all four 90 degree phase shifts during subsequent transients such that an equal number of transients are acquired for each of the four phase shifts, and wherein the receiver phase is inverted when the phase of the second pulse is shifted +90 degrees or −90 degrees relative to the phase of the second pulse used for the first transient and wherein a spin-echo technique or inversion-recovery $T_1$ measurement is carried out on the sample.

15. A method of analyzing a sample by pulsed nuclear magnetic resonance using a radiofrequency irradiation and detection coil which provides an inhomogeneous radiofrequency field, comprising reducing nuclear magnetic resonance signals from regions where a single radiofrequency pulse angle differs from $\pi/2$ radians by applying a second pulse after a first pulse prior to signal detection by a receiver, wherein the second pulse has a pulse angle twice as large as the pulse angle of the first pulse and the phase of the second pulse is alternated through all four 90 degree phase shifts during subsequent transients such that an equal number of transients are acquired for each of the four phase shifts, and wherein the receiver phase is inverted when the phase of the second pulse is shifted +90 degrees or −90 degrees relative to the phase of the second pulse used for the first transient and wherein at least one delay is provided between two or more of the said radiofrequency pulses.

16. A method in accordance with claim 15, wherein a pulsed magnetic field gradient is applied to the sample during a said delay period.

17. A method of analyzing a sample by pulsed nuclear magnetic resonance using a radiofrequency irradiation and detection coil which provides an inhomogeneous radiofrequency field, comprising reducing nuclear magnetic resonance signals from regions where a single radiofrequency pulse angle differs from $\pi/2$ radians by applying a second pulse after a first pulse prior to signal detection by a receiver, wherein the second pulse has a pulse angle twice as large as the pulse angle of the first pulse and the phase of the second pulse is alternated through all four 90 degree phase shifts during subsequent transients such that an equal number of transients are acquired for each of the four phase shifts, and wherein the receiver phase is inverted when the phase of the second pulse is shifted +90 degrees or −90 degrees relative to the phase of the second pulse used for the first transient and wherein at least one magnetic field gradient is applied to the sample during the application of a radiofrequency pulse.

18. A method of analyzing a sample by pulsed nuclear magnetic resonance using a radiofrequency irradiation and detection coil which provides an inhomogeneous radiofrequency field, comprising reducing nuclear magnetic resonance signals from regions where a single radiofrequency pulse angle differs from $\pi/2$ radians by applying a second pulse after a first pulse prior to signal detection by a receiver, wherein the second pulse has a pulse angle twice as large as the pulse angle of the first pulse and the phase of the second pulse is alternated through all four 90 degree phase shifts during subsequent transients such that an equal number of transients are acquired for each of the four phase shifts, and wherein the receiver phase is inverted when the phase of the second pulse is shifted +90 degrees or −90 degrees relative to the phase of the second pulse used for the first transient and wherein radiofrequency pulses are applied with a first radiofrequency coil and signal acquisition is carried out using a second radiofrequency coil.

19. A method of analyzing a sample by pulsed nuclear magnetic resonance using a radiofrequency irradiation and detection coil which provides an inhomogeneous radiofrequency field, comprising reducing nuclear magnetic resonance signals from regions where a single radiofrequency pulse angle differs from $\pi/2$ radians by applying a second pulse after a first pulse prior to signal detection by a receiver, wherein the second pulse has a pulse angle twice as large as the pulse angle of the first pulse and the phase of the second pulse is alternated through all four 90 degree phase shifts during subsequent transients such that an equal number of transients are acquired for each of the four phase shifts, and wherein the receiver phase is inverted when the phase of the second pulse is shifted +90 degrees or −90 degrees relative to the phase of the second pulse used for the first transient and wherein some radiofrequency pulses are applied with a first radiofrequency coil and the remaining radiofrequency pulses are applied with one or more other radiofrequency coils.

20. A method of analyzing a sample by pulsed nuclear magnetic resonance using a radiofrequency irradiation and detection coil which provides an inhomogeneous radiofrequency field, comprising reducing nuclear magnetic resonance signals from regions where a single radiofrequency pulse angle differs from $\pi/2$ radians by applying a second pulse after a first pulse prior to signal detection by a receiver, wherein the second pulse has a pulse angle twice as large as the pulse angle of the first pulse and the phase of the second pulse is alternated through all four 90 degree phase shifts during subsequent transients such that an equal number of transients are acquired for each of the four phase shifts, and wherein the receiver phase is inverted when the phase of the second pulse is shifted +90 degrees or −90 degrees relative to the phase of the second pulse used for the first transient and wherein one or more of the radiofrequency pulses is a complex radiofrequency pulse.

21. A method in accordance with claim 20, wherein the complex pulse is a composite or shaped pulse.

22. Apparatus for obtaining an NMR spectrum from a sample, comprising means for generating a static magnetic field, a support for supporting the sample in the static magnetic field, means for generating a plurality of radiofrequency pulse sequences as defined in any one of claims 1–21, irradiation means including a radiofrequency irradiation coil adjacent to the sample support having an inhomogeneous radiofrequency field in the intended region of the sample, means for applying the plurality of pulse sequences to the coil, and means for detecting an NMR signal from a sample supported by the sample support.

23. Apparatus as claimed in claim 22, wherein the irradiation or detection means includes one or more further coils in the region of the sample support.

24. A method as claimed in claims 12, or 13, or 14, or 15, or 16, or 17, or 18, or 19, or 20, or 21, wherein nuclear magnetic resonance signals from regions where a single pulse angle differs from $\pi/2$ radians is reduced by the addition of one or more further pulses subsequent to the first and second pulses such that a further signal reduction is obtained for each further pulse, the pulse angles of the further pulses being twice as large as the first pulse angle and the phases of all pulses except the first being alternated through all four 90 degree phase shifts during a series of transients such that an equal number of transients are acquired for each of the four 90 degree phase shifts of each pulse during which all other pulse phases are held constant, and wherein the receiver phase is inverted whenever the total number of pulses, whose phases have been shifted by +90 degrees or −90 degrees relative to the phases of the pulses prior to the first transient, is an odd number.

25. A method as claimed in claims 12, or 13, or 14, or 15, or 16, or 17, or 18, or 19, or 20, or 21, wherein nuclear magnetic resonance signals from regions of the sample where a single pulse angle differs from $\pi/2$ radians is further reduced by the application of an additional pulse prior to the first and second pulses, the pulse angle of the additional pulse being twice as large as the first pulse and the phase of the additional pulse being alternated between 0 degrees and 180 degrees in addition to the phase alternation of the second pulse such that an equal number of transients are acquired for each of the 0 degree and 180 degree pulse phases of the additional pulse during which all other pulse phases are held constant and such that an equal number of transients are acquired for each of the four 90 degree phase shifts of the second pulse during which all other pulse phases are held constant, and wherein the receiver phase is inverted when the phase of the second pulse is shifted by +90 degrees or −90 degrees relative to the phase of the second pulse used for the first transient.

26. A method as claimed in claims 12, or 13, or 14, or 15, or 16, or 17, or 18, or 19, or 20, or 21, wherein nuclear magnetic resonance signals from regions of the sample where a single pulse angle differs from $\pi/2$ radians is further reduced by the application of an additional pulse prior to the first and second pulses and by the application of one or more further pulses subsequent to the first and second pulses such that a signal reduction is obtained for each additional and further pulse provided the pulse angles of the additional and further pulses are twice as large as the pulse angle of the first pulse and the phase of the additional pulse is alternated between 0 degrees and 180 degrees and the phases of the second and further pulses are alternated through all four 90 degrees phase shifts such that an equal number of transients are acquired for all phase combinations of the additional, second and further pulses, and wherein the receiver phase is inverted for all phase combinations for which an odd number is obtained for the sum of the number of the second and further pulses having phases +90 degrees and −90 degrees relative to the phases for the first transient.

27. A method for obtaining a nuclear magnetic resonance signal from a localized region of a sample using radiofrequency irradiation coils which provide inhomogeneous radiofrequency fields, which method comprises applying to the sample a plurality of radiofrequency pulse sequences with a first radiofrequency coil and changing the phase or the pulse length (or angle) or both of the constituent pulses of said pulse sequences and acquiring a transient NMR signal after each pulse sequence with a second radiofrequency coil.

28. A method for obtaining a nuclear magnetic resonance signal from a localized region of a sample using radiofrequency irradiation coils which provide inhomogeneous radiofrequency fields, which method comprises applying to the sample a plurality of radiofrequency pulse sequences and changing the phase or the pulse length (or angle) or both of the constituent pulses of said pulse sequences wherein some radiofrequency pulses are applied with a first radiofrequency coil and the remaining radiofrequency pulses are applied with one or more other radiofrequency coils.

* * * * *